United States Patent
Bashark

[11] Patent Number: 5,130,624
[45] Date of Patent: Jul. 14, 1992

[54] ELECTRONIC CONTROL FOR AN AUTOMATIC WASHING MACHINE WITH A REVERSING PSC MOTOR

[75] Inventor: Larry T. Bashark, St. Joseph Township, Berrien County, Mich.

[73] Assignee: Whirlpool Corporation, Benton Harbor, Mich.

[21] Appl. No.: 392,368

[22] Filed: Aug. 11, 1989

[51] Int. Cl.$^5$ .............................................. H02P 1/40
[52] U.S. Cl. ..................... 318/280; 318/284; 318/286; 318/817; 318/809; 318/375; 318/742; 318/751; 68/12.01
[58] Field of Search ............... 318/757, 257, 817, 455, 318/795, 772, 729, 775, 778, 779, 796, 806, 809, 812, 822, 798, 280, 727, 681, 430, 434, 435, 282, 286, 284, 739, 742, 751; 100/229 A; 68/12 R, 133, 134

[56] References Cited

U.S. PATENT DOCUMENTS

| 4,779,431 | 10/1988 | Burk et al. | 68/12 R |
| 4,950,969 | 8/1990 | Getz | 318/257 |
| 4,972,134 | 11/1990 | Getz et al. | 318/817 |

Primary Examiner—William M. Shoop, Jr.
Assistant Examiner—John W. Cabeca
Attorney, Agent, or Firm—Mason, Kolehmainen, Rathburn & Wyss

[57] ABSTRACT

A control for an automatic washing machine with a reversing permanent split capacitor (PSC) drive motor. Separate ferrite core sensors surround each of two PSC motor windings. A sense winding is threaded through both sensors. A brief output voltage is generated whenever the alternating current in either PSC motor winding passes through a zero-crossing and when the sense winding is wound with proper mutual polarity, an output voltage is generated in response to zero-crossings of a brief, residual alternating current which flows in both PSC motor windings and the capacitor when the rotating PSC motor is cycled OFF. The circuitry, in combination with the sensors, samples the leading or lagging phase angle of the PSC motor auxiliary or main winding, respectively, at a sample rate of two-times the line frequency when the PSC motor is ON; and further monitors the PSC motor braking phenomena by counting the residual current alternations when the PSC motor is cycled OFF following the powered portion of each CW or CCW agitator stroke. The raw PSC motor phase data is used in microcomputer programs to compute motor start time or load torque dither. This computed information and the PSC motor braking data, is used by other software programs to automatically control various functions of the washing machine such as the fill water level and agitator stroke angle; to control events in an operational sequence such as the duration of the agitation and spin operations; and to provide diagnostic information such as spin off-balance detection.

54 Claims, 17 Drawing Sheets

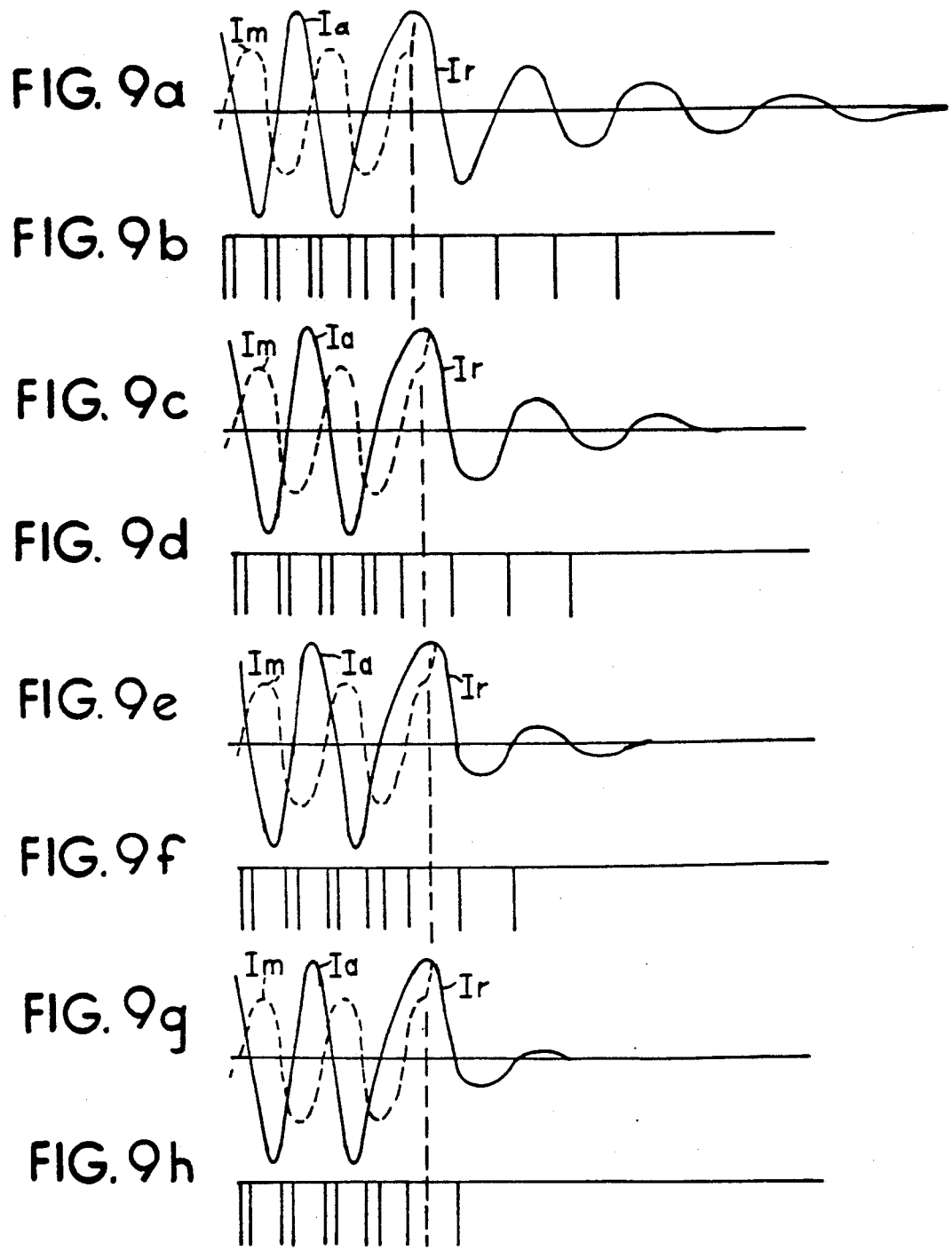

ELECTRONIC CONTROL FOR AN AUTOMATIC WASHING MACHINE WITH A REVERSING PSC MOTOR

CROSS REFERENCE TO RELATED APPLICATION

This application is related to an application entitled "ELECTRONIC CONTROL FOR AN AUTOMATIC WASHING MACHINE WITH A REVERSING PSC MOTOR," Ser. No. 07/392,473, filed concurrently herewith by the same inventor names in the present application, and now abandoned.

BACKGROUND OF THE INVENTION

1. Field of the Invention

The present invention relates to a control system for an apparatus having a permanent split capacitor (PSC) motor and more particularly to a control for an automatic washing machine having a reversing PSC motor wherein the operations of the washing machine are controlled in response to phase angles of the motor determined from sensed zero crossings of current flowing through the motor's windings when the motor is on and in response to the sensed zero crossings of residual motor generated current flowing through the motor's windings when the motor is off.

2. Description of the Prior Art

A control system for various appliances having an AC induction drive motor including an automatic washing machine is shown in my U.S. Pat. No. 4,481,786. That control system employs a ferrite core sensor having a primary winding that is formed of two turns of the drive motor's run winding, the sensor having a single turn secondary winding that forms a sense winding coupled to a motor phase monitoring circuit. The sense winding provides a signal representing a polarity change in the run winding current. The current polarity change signal is used by the motor phase monitoring circuit to provide a voltage compensated motor phase angle pulse to a microcomputer for the appliance to control various operations of the appliance. More particularly, a digital representation of the motor phase angle pulse is used by the microcomputer to monitor the starting of the drive motor by detecting a characteristic decrease in the motor phase angle representation. The motor phase angle representation is further used by the microcomputer of an automatic washing machine to determine the agitator torque which is in turn used by the microcomputer to automatically control the water level of the washing machine. An average motor torque number is also determined from the motor phase angle representation wherein the average motor torque number is used to provide an end of drain control for the washing machine.

The washer agitator torque routine (WATR) in FIG. 10 of U.S. Pat. No. 4,481,786 applies to washing machines which use a complex transmission to define the stroke angle and to convert the rotary motion of the motor into a back-and-forth, clockwise (CW) and counterclockwise (CCW) agitator motion. The motor of U.S. Pat. No. 4,481,786 rotates continuously and in a single direction during each clothes agitation period. The mid-stoke agitator torque is inferred by using the microcomputer to store the maximum and minimum motor phase number during each CW and CCW agitator stroke and compute the difference. The maximum motor phase number during each CW and CCW stroke occurs when the transmission gears are positioned such that the agitator is in hesitation. This number provides a base-line or reference motor phase number unaffected by agitator torque to which the minimum motor phase number or mid-stroke agitator torque can be compared.

The present invention applies to washing machines wherein each reversal of direction of the agitator is achieved by stopping and restarting the drive motor in the opposite direction. Washing machines of the present invention may use a transmission, but the transmission is relatively simple and provides a basic motor speed reduction and/or torque multiplication function. The direction of rotation of the motor determines the agitation direction and the angle of rotation of the motor shaft in conjunction with the transmission gear-ratio determines the agitation stroke angle. The present invention teaches how to use information from the motor electrical parameters to provide a closed-loop automatic water level control function in the absence of the above base-line or reference motor phase information as such information is not available with a washing machine having a simple, speed-reducing transmission. Also, the preferred embodiment pertains to a permanent split capacitor (PSC) drive motor as PSC motors are generally more amenable in applications requiring frequent starting, stopping and reversal of the motor rotational direction than split phase induction motors.

It has been found that automatic washing machines having reversing PSC drive motors cannot be as accurately controlled by the control system shown in U.S. Pat. No. 4,481,786 as washing machines having AC induction motors because the motor start time of a PSC motor varies not only with the size of the clothes load but with variations in the installation line voltage. More particularly, for a washing machine having a reversing PSC motor, the line voltage affects the motor start time more than the size of the clothes load. Further, the motor phase angle of a PSC motor does not change in the same manner as the motor phase angle of an AC induction motor since there is not a characteristic decrease in the phase angle of the PSC motor indicative of the motor reaching its operating speed. Another difference between washing machines having an AC induction motor and washing machines having a PSC motor is that the stroke angle and stroke rate of an agitator driven by an AC induction motor is fixed; whereas, the stroke angle and stroke rate of an agitator driven by a reversing PSC motor is variable.

SUMMARY OF THE INVENTION

Accordingly, it is an object of the present invention to provide a control system for a PSC motor that overcomes many of the disadvantages of the prior art control systems.

It is another object of the present invention to provide a method and apparatus for determining the braking force on a PSC motor by monitoring the residual current generated by the motor after the motor has been cycled off.

It is yet another object of the present invention to control various operations of a washing machine based on the braking force measured.

In accordance with the present invention, the disadvantages of prior control systems for automatic washing machines with reversing PSC motors have been overcome. The electronic control system of the present invention controls various operations of an automatic washing machine with a reversing PSC motor in response to a representation of the residual alternating current flowing through the motor windings when the motor is cycled off. It has been found that the residual alternating current is substantially unaffected by the installation line voltage because the PSC motor is disconnected from the line voltage when the PSC motor is cycled off during a hesitation period. It is during the hesitation period that the motor's braking action takes place. The duration of the residual alternating current during the hesitation period is inversely proportional to the braking force on the motor wherein the braking force is an indication of the size of the clothes load in the washing machine. Further, the motor's phase angle is analyzed in a manner particular to reversing PSC motors in order to determine the start time of the motor, i.e., the time at which the motor reaches its operating speed and further to control various operations of the washing machine not shown in U.S. Pat. No. 4,481,786.

The electronic control system of the present invention senses zero crossings of alternating current in at least one winding of the PSC motor when the motor is on to provide a representation thereof and when the motor is cycled off to provide a representation of residual current flowing through the motor winding. The residual current is generated by the motor which acts as a generator as it continues to rotate for a period of time after it has been de-energized. The control also detects zero crossings of the line voltage to provide a signal representative thereof wherein a motor phase angle representation is determined in response to the time from the voltage zero crossing signal to the current zero crossing signal.

In order to sense the zero crossings of alternating current in a winding of the PSC motor, a ferrite core transformer sensor is employed having a primary winding that includes at least one turn of a motor winding and a secondary winding at which the current zero crossing signal is generated. In the preferred embodiment, two ferrite core transformer sensors are employed wherein the primary winding of a first sensor includes at least one turn of a first motor winding and the primary winding of the second sensor includes at least one turn of a second motor winding. A sense winding extends through the first and second ferrite core transformers to form the secondary windings thereof wherein the polarity of the sense winding is such that the signals from each ferrite core transformer are additive when the motor is cycled off.

The electronic control of the present invention is responsive to the residual alternating current representation to determine the size of the load in the washing machine during water fill, agitation or rinse operations. The electronic control further automatically controls the water level in the washing machine in response to the residual alternating current representation. During the automatic water level control operation, the electronic control determines whether an overload condition exists from the residual alternating current representation and further determines whether to agitate or not while increasing the water level. The residual alternating current representation is further used to determine the optimal duration of a stroke, i.e., stroke angle, and the stroke rate of the washing machine's agitator such that the larger the load indicated by the residual alternating current representation, the greater the stroke angle or duration. The duration of agitation during wash and rinse cycles of the washing machine is further controlled in response to the water level which is in turn determined from the residual alternating current representation.

These and other objects, advantages and novel features of the present invention, as well as details of an illustrated embodiment thereof, will be more fully understood from the following description and the drawing.

BRIEF DESCRIPTION OF THE DRAWING

FIG. 2 is a schematic diagram illustrating the voltage regulator circuit shown in FIG. 1a;

FIG. 3 is a schematic diagram illustrating the volt pulse circuit shown in FIG. 1a;

FIG. 4 is a schematic diagram illustrating the current pulse circuit shown in FIG. 1a;

FIG. 5 is a schematic diagram illustrating the watchdog circuit shown in FIG. 1a;

FIG. 6 is a schematic diagram illustrating the triac driver circuit shown in FIG. 1a;

FIG. 7 is a schematic diagram illustrating the solenoid driver circuit shown in FIG. 1a;

FIG. 8a is a graphical representation of the voltage and current waveforms associated with the PSC motor shown in FIG. 1a;

FIG. 8b is a graphical representation of the output from the voltage regulator circuit shown in FIG. 1a;

FIG. 8c is a graphical representation of the output from the volt pulse circuit shown in FIG. 1a;

FIG. 8e is a graphical representation of the output of the current pulse circuit shown in FIG. 1a;

FIGS. 9a, 9c, 9e and 9g are graphical representations illustrating the PSC motor's main and auxiliary winding currents for clothes loads of various sizes ranging from no load in FIG. 9a to a full capacity load in FIG. 9g;

FIGS. 9b, 9d, 9f and 9h are graphical representations illustrating the output of the current pulse circuit shown in FIG 1a generated in response to the sensor outputs for the motor winding currents respectively shown in FIGS. 9a, 9c, 9e and 9g;

DESCRIPTION OF THE PREFERRED EMBODIMENT

Figure 20:
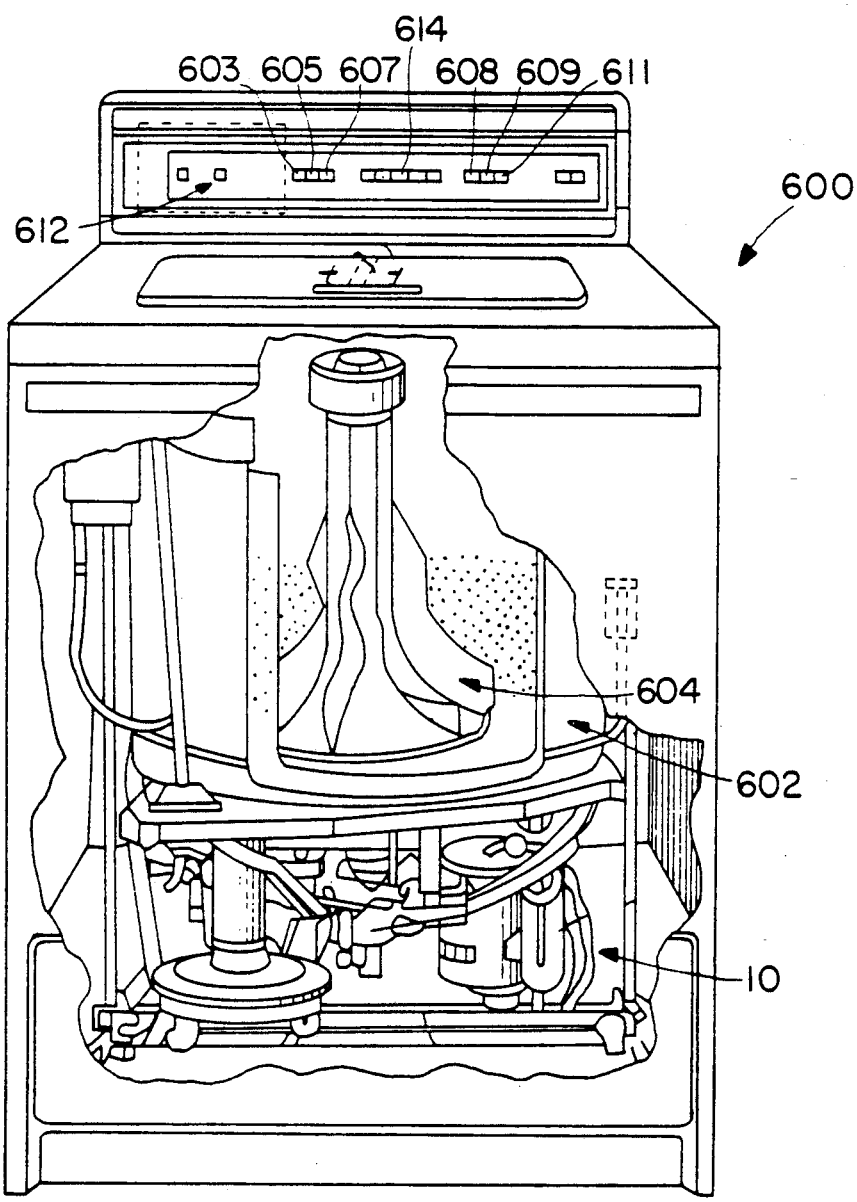
FIG. 20 is a perspective view of a vertical axis automatic clothes washing machine employing the control system of the present invention.

The control system of the present invention is used to control various operations of a vertical axis clothes washing machine 600 as shown in FIG. 20. The washing machine 600 includes a reversing permanent split capacitor (PSC) motor 10 that drives a spin basket 602 in one direction during a spin operation of the washing machine. The PSC motor 10 is also coupled to an agitator 604 for driving the agitator 604 in clockwise and counterclockwise directions wherein the PSC motor 10 includes a pair of motor windings which alternatively serve as the main motor winding and auxiliary motor winding upon each reversal of the PSC motor 10. The powered portion of each clockwise and counterclockwise agitator stroke occurs when the motor 10 is cycled on. Between each clockwise and counterclockwise stroke is a hesitation period during which time the PSC motor 10 is cycled off to allow the PSC motor 10 and the agitator 604 to come to a complete stop before the direction of the PSC motor 10 and the agitator 604 is reversed.

Figure 1A:
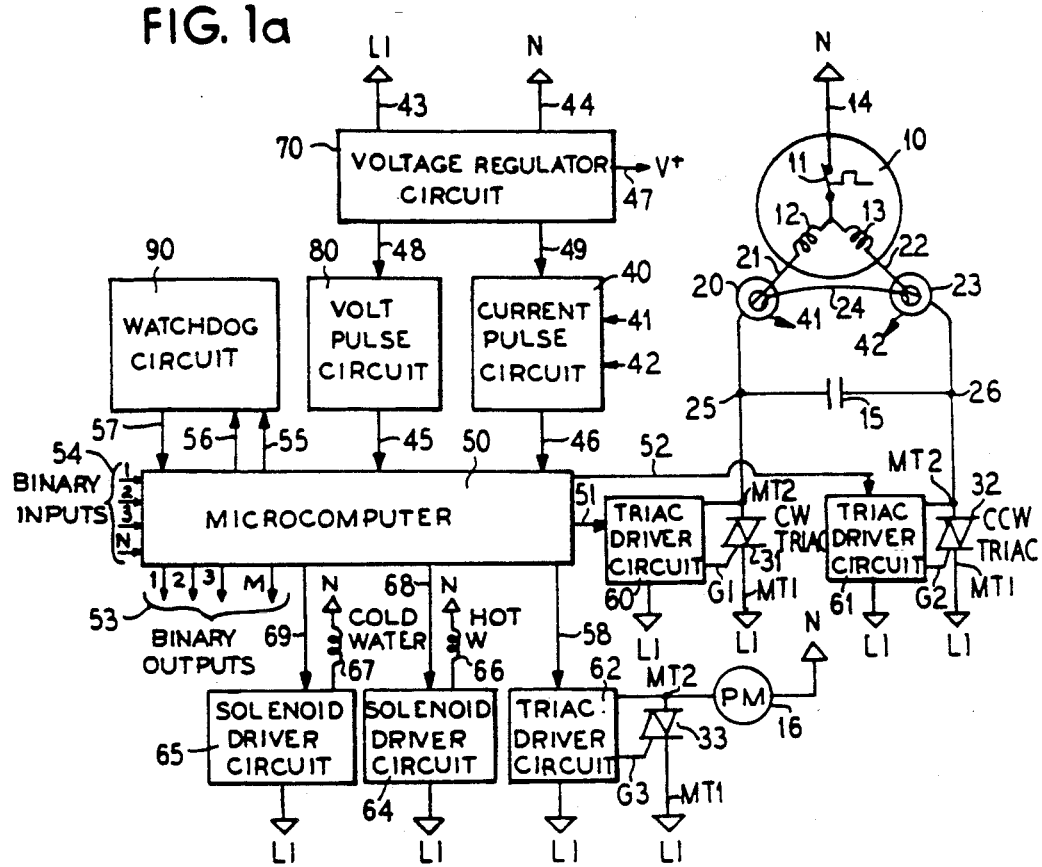
FIG. 1a is a schematic diagram of a control circuit for an automatic washing machine having a reversing permanent split capacitor motor and two ferrite core sensors.

The control system of the present invention as shown in FIG. 1a and described in detail below senses the zero crossings of current flowing through the windings of the PSC motor 10 to provide current pulses 46 representative thereof. The system further generates volt pulses 45 representing the zero crossings of the alternating line voltage servicing the washing machine. The control system is responsive to the volt pulse and current pulse signals 45 and 46 to monitor the phase angle of the main and/or auxiliary windings of the PSC motor 10 during each line voltage half cycle when the motor is on to provide phase angle information. When the motor is cycled off, the control system of FIG. 1a is responsive to the current pulses 46 representing the zero crossings of the residual current flowing through the motor windings to provide residual current information.

The control system of the present invention utilizes various relationships between the motor's phase angle and motor torque and between the residual current and motor torque to control various operations of the washing machine. One such relationship is that the lagging phase angle of the main winding current of the PSC motor 10 is inversely related to the motor torque. Another such relationship is that the leading phase angle of the auxiliary winding current of the PSC motor 10 is directly related to the motor torque. A further relationship is that the duration of the residual alternating current flowing through the PSC motor windings when the motor is cycled off is inversely related to the motor torque.

More particularly, a microcomputer 50 shown in FIG. 1a is dedicated during a portion of each line half cycle to monitor timing relationships between the volt and current pulse signals 45 and 46 with crystal controlled clock cycles. Through the speed of the microcomputer 50, all data processing and/or decision making is completed before the arrival of any volt or current pulse information for the next line half cycle.

Figure 11:
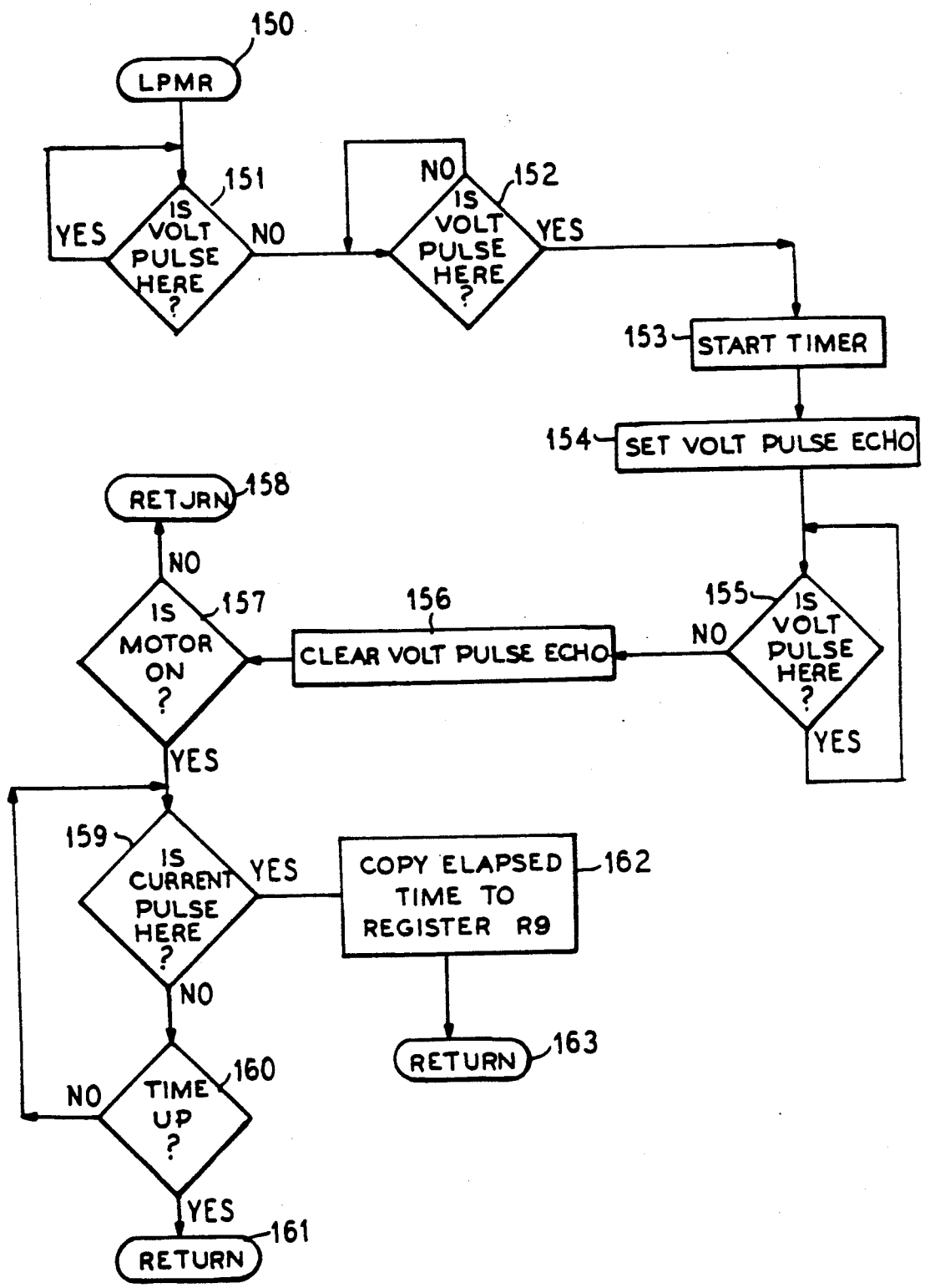
FIG. 11 is a flow chart illustrating the lagging phase monitoring routine LPMR.

The microcomputer 50, when operating in accordance with the lagging phase monitoring routine LPMR, shown in FIG. 11, determines the lagging phase angle of the PSC motor 10 to provide a representation thereof. From the lagging phase angle of the PSC motor 10, the microcomputer 50 in accordance with the motor start routine MSR shown in FIG. 12 determines the starting time of the PSC motor 10 by detecting a characteristic increase in the lagging phase angle indicating that the PSC motor 10 has reached its operating speed.

From the motor start time, the microcomputer 50 determines the size of the clothes load in the washing machine 600 during a spin operation. More particularly, during a spin operation the PSC motor 10 drives the spin basket 602 of the washing machine 600 in one direction so that the motor start time represents the spin basket acceleration time, i.e., the time at which the spin basket reaches its operating or preferred spin speed. During the spin operation, the microcomputer 50, when operated in accordance with the off balance routine OBR 500 shown in FIG. 18, determines the amount of dither in the motor torque from the lagging phase angle of the motor and from the amount of dither determines whether an off balance condition exists. The microcomputer 50, operating in accordance with the spin routine SPNR shown in FIG. 19, further determines the duration of the spin operation from the motor start time and a cycle parameter.

The cycle parameter is calculated by the microcomputer 50 in accordance with the cycle routine CR (FIG. 13) in response to the cycle selection of the user. The user may select a delicate cycle, a permanent press cycle or a normal cycle by actuating a respective cycle selection button 603, 605 and 607 disposed on the washing machine 600. The user may further select the temperature of the wash cycle by actuating a temperature selection button 608, 609 and 611 respectively representing a hot water wash, warm water wash or cold water wash. The temperature selection parameters are utilized by the microcomputer 50 to determine the duration of agitation during the wash and deep rinse periods of the washing machine as discussed below.

Figure 15:
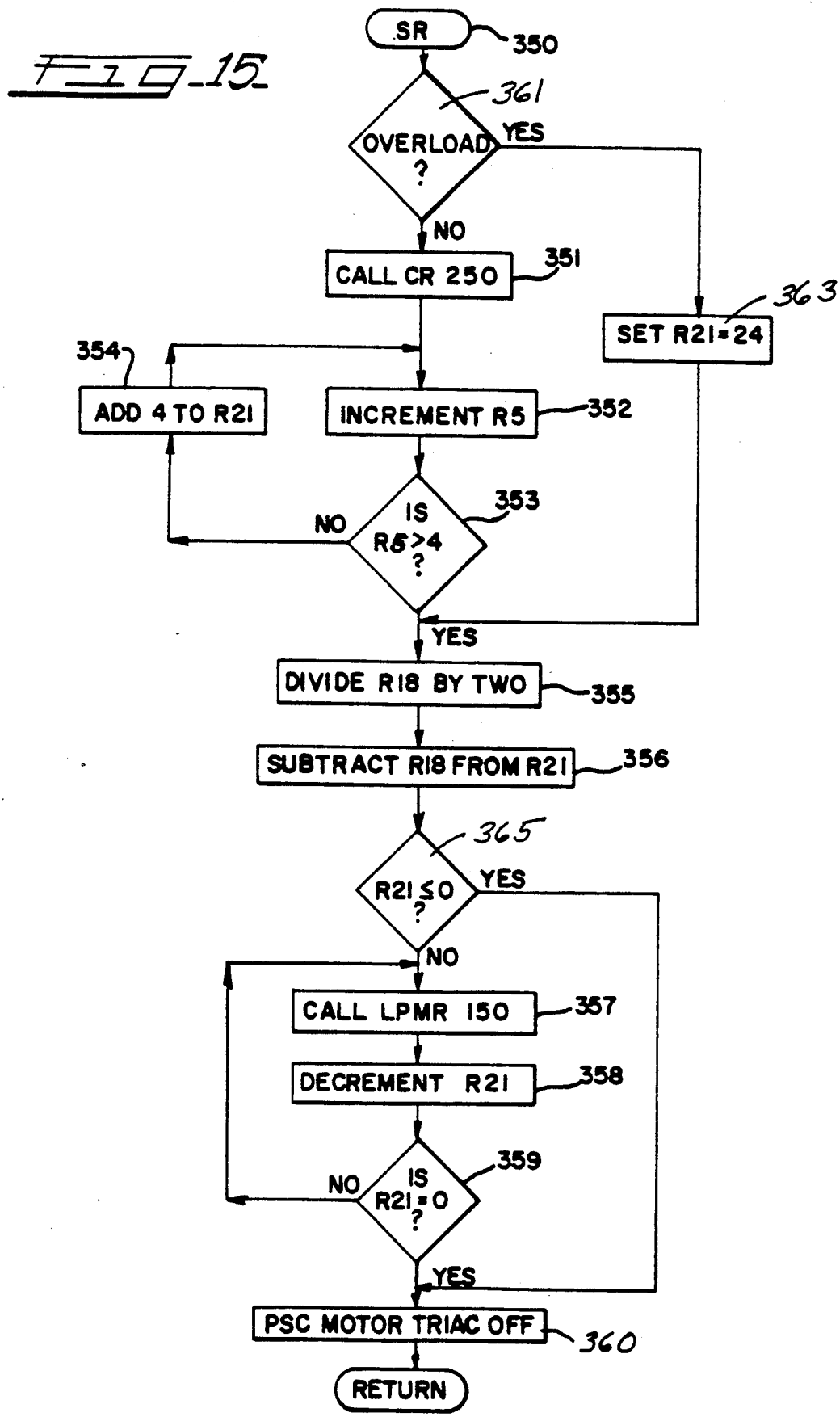
FIG. 15 is a flow chart illustrating the stroke routine SR.

When the PSC motor 10 is driving the agitator 604, for each agitator stroke, the motor start routine MSR is called to determine when the motor 10 reaches its operating speed. At this point, a stroke routine SR shown in FIG. 15 is called to complete the powered portion of the stroke. Following the powered portion of each clockwise and counterclockwise agitator stroke, the microcomputer 50 operates in accordance with the residual pulse count routine RPCR (FIG. 16) to count the number of current pulses 46 representing zero crossings of the residual alternating current flowing through the motor windings when the motor is cycled off. From the residual pulse count, the microcomputer 50 determines the size of the clothes load during the wash and rinse operations of the washing machine 600. The microcomputer 50, when operated in accordance with the stroke routine SR, determines the optimal duration of each agitator stroke, i.e. stroke angle, and the stroke rate in accordance with the residual pulse count from the previous stroke and the cycle parameter. For a given cycle parameter, the larger the size of the clothes load as indicated by a small residual pulse count, the greater the stroke angle. Further, for a given size clothes load, i.e., a given residual pulse count, the microcomputer 50 controls the angle of each agitator stroke such that for a delicate cycle selection, the stroke angle is smaller than for a permanent press cycle selection, the stroke angle for a permanent press cycle selection being smaller than the stroke angle for a normal cycle.

Figure 17:
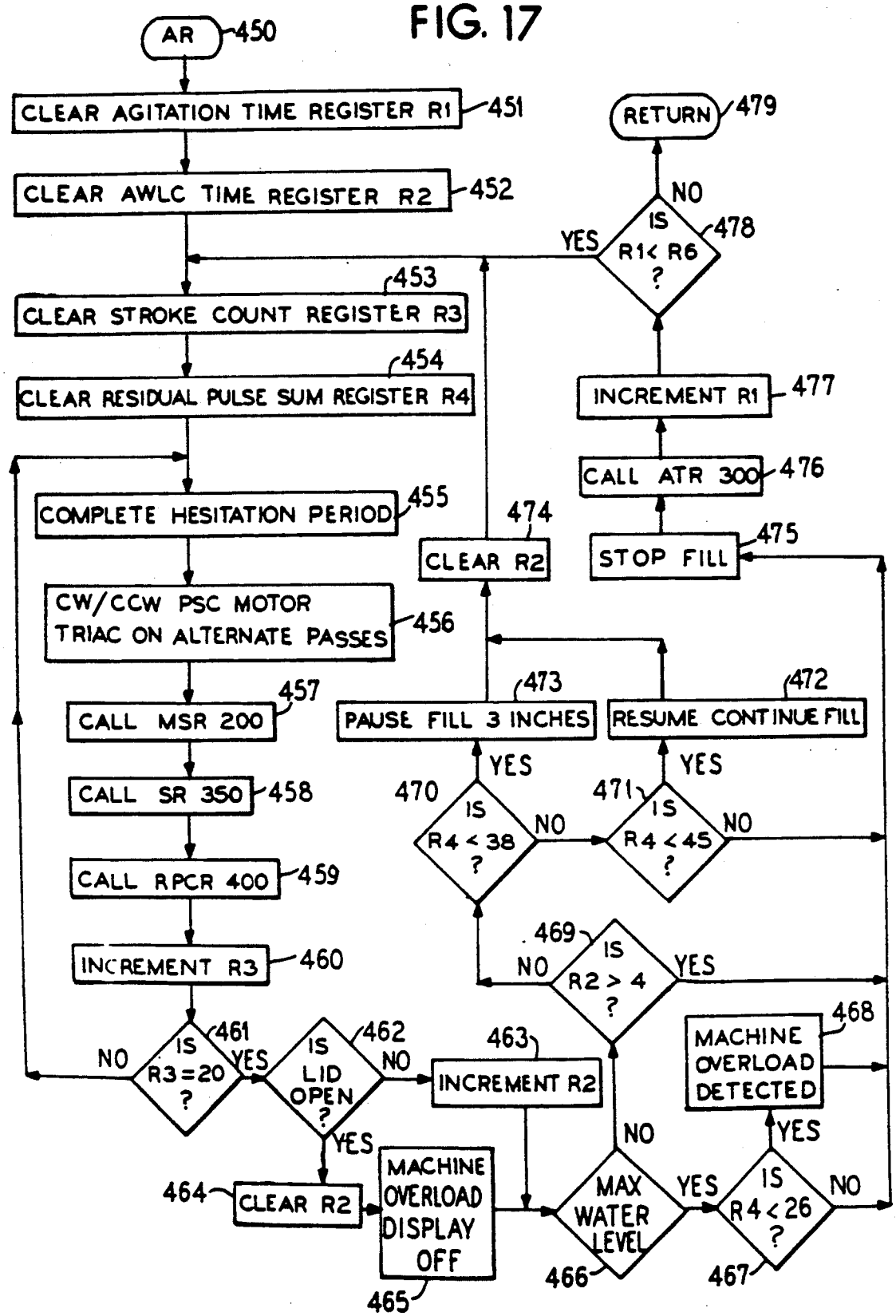
FIG. 17 is a flow chart illustrating the agitate routine AR.

The microcomputer 50 is further responsive to the residual pulse count to automatically control the level of water in the washing machine 600 when the microcomputer 50 is operated in accordance with the agitate routine AR shown in FIG. 17. In accordance with the agitate routine AR, the microcomputer 50 further determines whether an overload condition exists from the residual pulse count. The microcomputer 50, in accordance with the agitate routine AR, also determines whether to agitate or not while increasing the water level based on the residual pulse count. The microcomputer 50 further determines the duration of agitation during the wash and rinse agitation periods of the washing machine 600 in accordance with an agitate time routine ATR shown in FIG. 14. In accordance with the agitate time routine ATR, the water temperature selection parameter, the cycle selection parameter and the water level, i.e., size of the clothes load as determined by the microcomputer 50 from the residual pulse count, are used by the microcomputer 50 to determine the duration of agitation.

CONTROL SYSTEM CIRCUITRY

As shown in FIG. 1a, the PSC motor 10 has a thermal overload protector 11, a first motor winding 12 and a second motor winding 13. The first motor winding 12 is connected in series with terminal MT2 of clockwise, CW, triac 31, wherein a single-turn of the first motor winding 12 forms a primary winding 21 of a transformer sensor having a small ferrite core 20. The second motor winding 13 is connected in series with terminal MT2 of counterclockwise, CCW, triac 32, wherein a single-turn of the second motor winding 13 forms a primary winding 22 on a transformer sensor having a small ferrite core 23. To power the washing machine 600, the machine is connected to an alternating source of power of, for example, 120 VAC, 60 Hertz via a line L1 and a neutral line N as follows. A pump motor 16 is connected from the neutral line N to terminal MT2 of a pump motor triac 33. The main terminals MT1 of triacs 31, 32 and 33 are connected to the line L1 of the AC power source. A common electrical lead 14 completes a circuit path for both PSC motor windings 12 and 13 to the neutral line N of the AC power source through the overload protector 11. A permanent split capacitor 15 is connected between points 25 and 26 wherein point 25 is between the primary winding 21 of the ferrite core sensor 20 and terminal MT2 of CW triac 31 and point 26 is between the primary winding 22 of the ferrite core sensor 23 and terminal MT2 of CCW triac 32. A single-turn sense winding 24 is threaded through both cores 20 and 23 to maintain mutual polarity between the primary winding 21 and the sense winding 24 of the ferrite core sensor 20 and the primary winding 22 and sense winding 24 of the ferrite core sensor 23 as shown in FIG. 1a so that the signals from each ferrite core sensor are additive for the detection of the residual alternating current flowing through the motor windings when the PSC motor 10 is cycled off. The sense winding 24 is connected to a current pulse circuit 40 shown in detail in FIG. 4 by electrical leads 41 and 42.

Figure 8A:
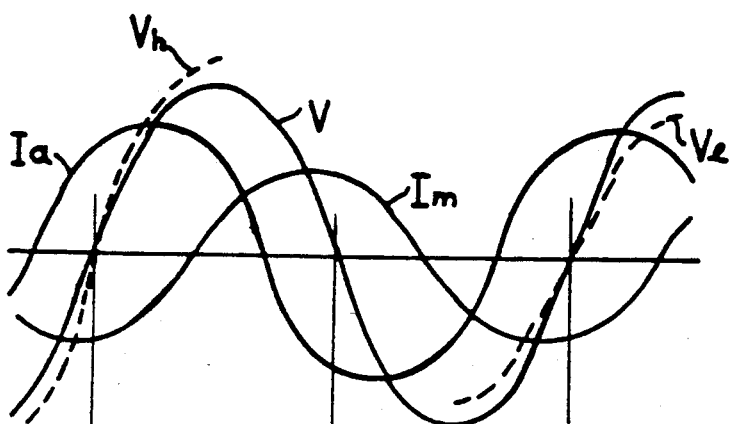

The CW and CCW triacs 31 and 32 are never ON simultaneously. As discussed above, there is always a brief hesitation period following the activation of one PSC motor triac 31, 32 before the other triac 31, 32 is energized to allow the agitator and PSC motor 10 to essentially come to a stop before energizing the PSC motor 10 in the opposite direction. The PSC motor 10 rotates in the clockwise CW direction when the CW triac 31 is ON and rotates in the counterclockwise, CCW, direction when the CCW triac 32 is ON. The PSC motor winding in series with the capacitor 15 is the AUXILIARY winding and the PSC motor winding which is not in series with the capacitor 15 is the MAIN winding. Thus, if the CW triac 31 is ON, PSC motor winding 12 is the main winding and the winding 13 is the auxiliary winding. Alternatively, if the CCW triac 32 is ON, the PSC motor winding 13 is the main motor winding and the winding 12 is the auxiliary motor winding. Under normal operating conditions, the current passing through the main winding will lag the line voltage and the current passing through the auxiliary winding will lead the line voltage. It is the nature of a reversing PSC motor 10 that the identity of the main and auxiliary windings switch each time that the motor operating direction is reversed. Typical voltage and current waveforms for a PSC motor 10 are shown graphically in FIG. 8a. As shown in FIG. 8a, the auxiliary winding current Ia leads the line voltage V and the main winding current, Im, lags the line voltage V. When the PSC motor 10 is fully accelerated, the magnitude of the auxiliary winding current Ia is larger than the main winding current Im.

Figure 2:
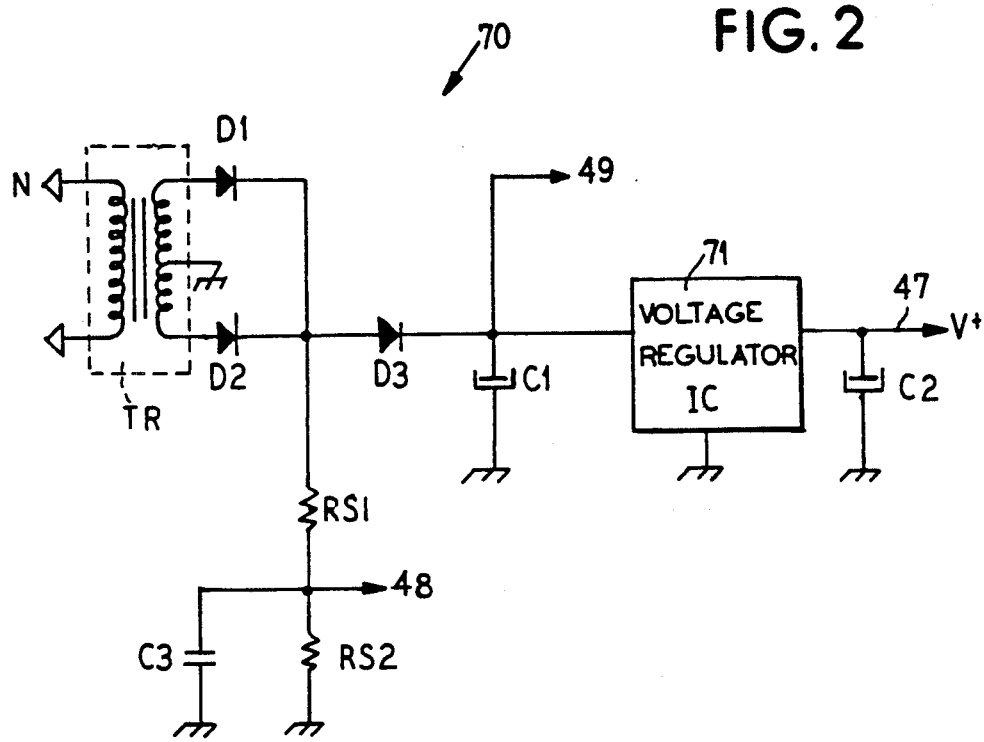

A voltage regulator circuit 70 shown in detail in FIG. 2, is coupled to the AC power source by electrical leads 43 and 44. The voltage regulator circuit 70 is used to generate a regulated source of DC voltage V+ on electrical line 47 appropriate for the microcomputer 50 and other electronics. The voltage regulator circuit 70 also provides a full-wave rectified signal voltage 48 (FIG. 8b) to the volt pulse circuit 80 shown in detail in FIG. 3 and a filtered, but unregulated DC bias voltage 49 to the current pulse circuit 40 shown in detail in FIG. 4.

Figure 5:
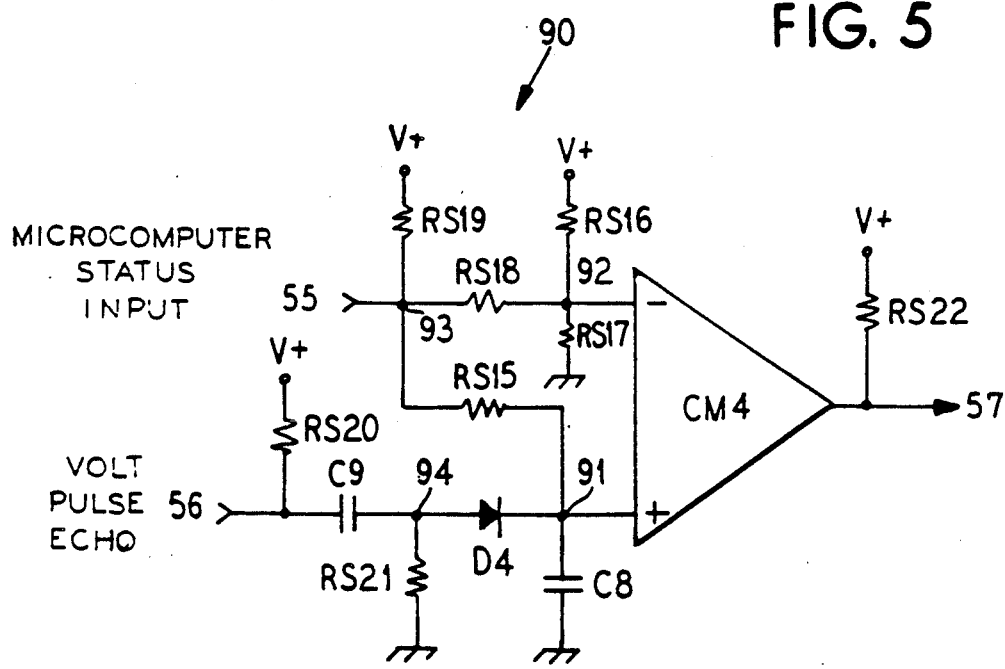

The volt pulse circuit 80 provides a binary volt pulse signal 45 (FIG. 8c) to the microcomputer 50 wherein each volt pulse represents a zero crossing of the alternating line voltage. The current pulse circuit 40 provides a binary current pulse signal 46 (FIG. 8e) to the microcomputer 50 wherein a current pulse is generated in response to the zero-crossings of current flowing through the primary windings 21 and 22 of the ferrite core sensors 20 and 23. A watchdog circuit 90, shown in detail in FIG. 5, is further coupled to the microcomputer 50 to provide thereto a binary RESET signal 57. The microcomputer 50, in turn, provides both a binary status signal 55 and a volt pulse echo signal 56 to the watchdog circuit 90.

One binary output 51 of the microcomputer 50 is used to control a first triac driver circuit 60 to provide a control signal which is applied to a gate lead G1 of the CW triac 31. The triac driver circuit 60 is also connected to main terminal MT2 of triac 31. A second binary output 52 of the microcomputer 50 is used to control a second triac driver circuit 61 to provide a control signal to a gate lead G2 of the CCW triac 32.

The triac driver circuit 61 is also connected to main terminal MT2 of triac 32. Similarly, a third binary output 58 of the microcomputer 50 is used to control a third triac driver circuit 62 to provide a control signal to a gate lead G3 of the pump motor triac 33. The triac driver circuit 62 is also connected to the main terminal MT2 of the triac 33. A binary output 68 of microcomputer 50 is connected to the solenoid driver circuit 64. The driver circuit 64 is used to control the hot water solenoid 66. The hot water solenoid 66 is connected from the neutral line N of the line voltage to the solenoid driver circuit 64. Similarly, a binary output 69 of the microcomputer 50 is connected to a solenoid driver circuit 65. The driver circuit 65 is used to control the cold water solenoid 66. The cold water solenoid 66 is connected from the neutral line N of the line voltage to the solenoid driver circuit 65. Both solenoid driver circuits 64 and 65 are also connected to the line L1 of the line voltage.

Additional binary output lines 53 may be required for various console indicators such as a machine overload light emitting diode LED 610 or additional triac or solenoid driver circuits. It will be apparent to those skilled in the art that some or all of the triac driver circuits may be replaced by relay driver circuits. Additional binary input lines 54 are coupled to a lid open sensing switch (not shown), the console cycle selection buttons 603, 605 and 607 and to the console wash water temperature selection buttons 608, 609 and 611. An additional binary input signal may be derived from a pressure-to-frequency transducer to provide a square-wave frequency signal which corresponds to an analog machine water level. Such additional binary inputs and outputs are known to those skilled in the art. It will further be apparent to those skilled in the art that the microcomputer 50 may be interfaced with the outside world through the use of a peripheral interface adapter integrated circuit to facilitate use of a large number of inputs and outputs with only a small number of actual microcomputer 50 binary input or output lines. It will also be apparent to those skilled in the art that a large number of triacs and other driver circuits and microcomputer input/output interfacing techniques may be used within the scope of the present invention. It will be apparent to those skilled in the art that an external crystal or ceramic resonator circuit is used in conjunction with the microcomputer 50 in accordance with manufacturer specification to define the internal clock cycles and timing functions. In the preferred embodiment the microcomputer 50 is a Texas Instruments TMS7040 which has an 8-bit word size.

The voltage regulator circuit 70 as shown in FIG. 2 generates a regulated DC voltage for all of the electronic circuits, a full-wave rectified signal voltage for the volt pulse circuit and an unregulated, DC bias voltage for the current pulse circuit. The voltage regulator circuit 70 includes a center-tapped step down transformer TR with diodes D1 and D2 to develop a 120 Hz, full-wave rectified voltage waveform. Capacitor C1 is a pre-filter and capacitor C2 is a post-filter for the voltage regulator integrated circuit 71. Diode D3 isolates the pre-filtered DC voltage at the input to the voltage regulator 71 from the full-wave rectified signal at the cathodes of the diodes D1 and D2. Resistors RS1 and RS2 form a voltage divider circuit and provide a sufficient load to forward bias the diodes D1 and D2. High frequency noise transduced from the primary winding to the secondary winding of the transformer TR is filtered by bypass capacitor C3. There are three outputs from the voltage regulator circuit 70. The V+ output 47 is a regulated DC voltage for the microcomputer 50 and other electronic circuits. A filtered, but unregulated DC voltage 49 is available to bias the sensitivity of the current pulse circuit 40 for the effect of variation in the line voltage on the magnitude of the PSC motor currents available at the ferrite core sensors 20 and 23. Further, a 120 Hz full-wave rectified signal voltage 48 (FIG. 8b) is developed for the volt pulse circuit 80. In the exemplary embodiment V+ is five volts.

Figure 3:
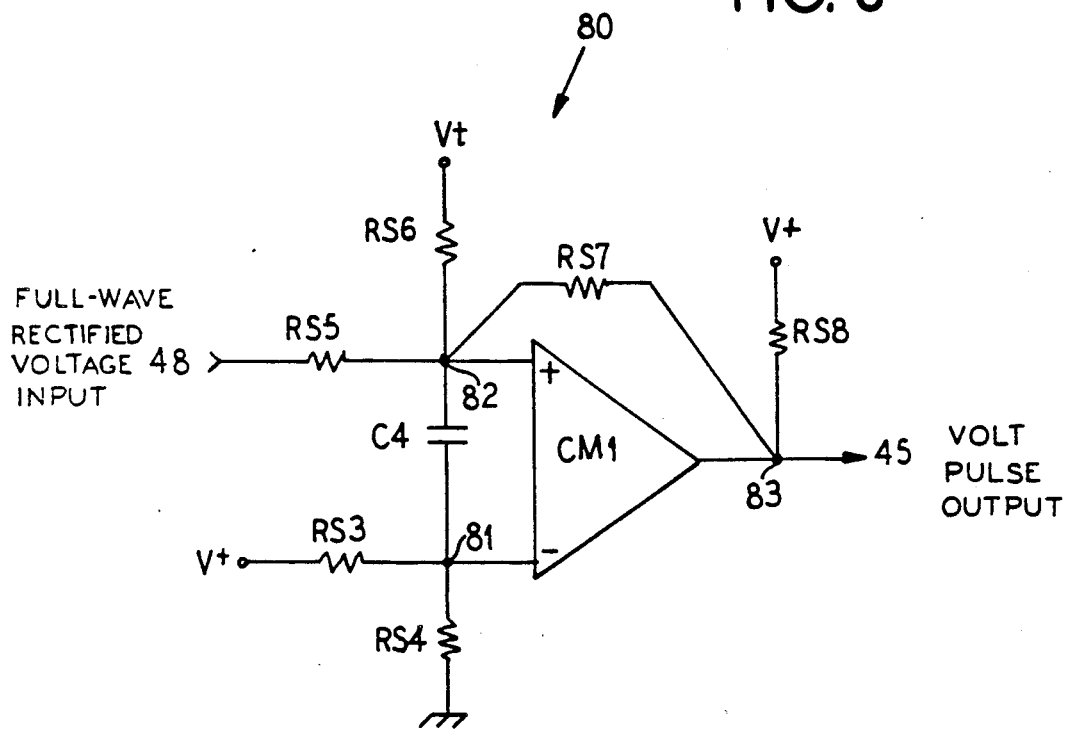

The volt pulse circuit 80 as shown in FIG. 3 receives a full-wave rectified voltage signal input from the voltage regulator circuit and generates a volt pulse train wherein each binary volt pulse straddles the line voltage zero-crossings. The volt pulses occur at two-times line frequency, regardless of whether the PSC motor is ON, and have a pulse width inversely related to the line voltage. The volt pulse circuit 80 comprises resistors RS3, RS4, RS5, RS6, RS7 and RS8, a capacitor C4 and a comparator CM1 which is supplied with V+ from the voltage regulator circuit 70. Resistor divider RS3 and RS4 is used to define a DC voltage threshold 81 at the inverting input of comparator CM1. The 120 Hz, full-wave signal 48 from the voltage regulator circuit 70 is applied to the noninverting input 82 of comparator CM1 through the resistor divider RS5 and RS6. Resistor RS7 is connected from the output 83 to the noninverting input 82 of comparator CM1 to provide hysteresis and thereby stabilize transitions of the volt pulse signal 45. A pull-up resistor RS8 is connected to V+ from the output 83 of comparator CM1. Capacitor C4 filters any remaining high frequency noise across the inputs of comparator CM1.

Figure 8B:
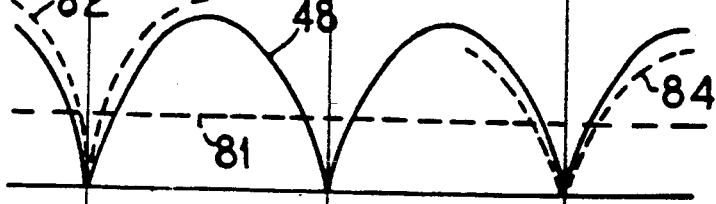
Figure 8C:
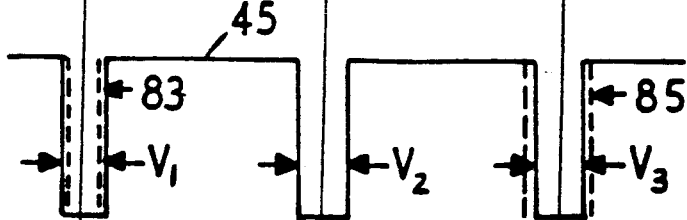

The full-wave rectified voltage signal 48 and DC voltage threshold 81 are shown graphically in FIG. 8b. The volt pulse train 45 at the output of comparator CM1 is shown graphically in FIG. 8c. The volt pulses occur at two-times the line voltage frequency regardless of whether the PSC motor 10 is ON or OFF. For a 60 Hz source, there are 120 volt pulses per second. As shown in FIG. 8a, 8b and 8c, the width of each volt pulse may vary in accordance with the amplitude of the line voltage and hence in accordance with the full-wave rectified waveform 48 which determines the steepness or slope of the waveform in the vicinity of the zero value. If line voltage V of FIG. 8a and hence, the full-wave rectified waveform 48 of FIG. 8b are assumed to be average or mean waveforms which produce the pulses shown in the solid line 45, a line voltage waveform Vh as shown in FIG. 8a having a larger than average amplitude will produce a full-wave rectified waveform 82 with a larger than average amplitude wherein a narrower pulse 83, as shown in broken lines in FIG. 8c is generated in response thereto. Similarly, a line voltage waveform Vl having a smaller than average amplitude will produce a full-wave waveform 84 having a smaller amplitude than the waveform 48 so as to provide a wider pulse 85, also shown in broken lines in FIG. 8c. Three successive voltage pulses V1, V2 and V3 are shown in FIG. 8c in relation to the full-wave rectified waveform 48. A continuous series of these volt pulses 45 is supplied to the microcomputer 50 whenever the washing machine 600 is connected to the service voltage, i.e., line voltage.

The current flowing through the windings 12 and 13 of the PSC motor is sensed by the ferrite core transformer sensors 20 and 23 as follows. In accordance with Faraday's law of voltage induction, the electromotive force, or voltage, induced across the sense winding 24 is proportional to the rate of change of the magnetic flux of cores 20 and 23. The cores 20 and 23 quickly saturate immediately following each current zero-crossing of the primary winding currents in wires 21 and 22, respectively. Thus, a sharp voltage spike is generated across terminals 41 and 42 of the sense winding 24 whenever the current passing through either of the PSC motor winding 12 or 13 reverses polarity or passes through a zero-crossing. Each core 20 and 23 generates a train of alternating positive and negative voltage spikes at a rate of two-times the line frequency. The magnitude and sharpness of each spike is proportional to the rate of change of the current flowing through the primary winding 21, 22 at the zero-crossing. However, it is the timing relationships between the the line voltage and motor current zero-crossings which is of interest to the present invention as well as the duration of the residual alternating current flowing through the motor windings 12 and 13 and not the magnitude of the motor current per se or the magnitude of the induced voltage spikes.

Figure 8D:
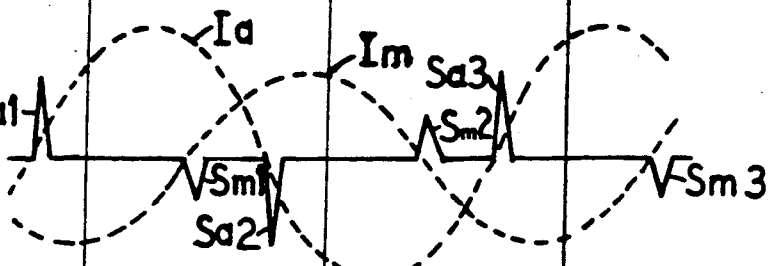
FIG. 8d is a graphical representation of the output of the ferrite core sensors with the dashed lines representing the auxiliary and main winding currents.
Figure 8E:
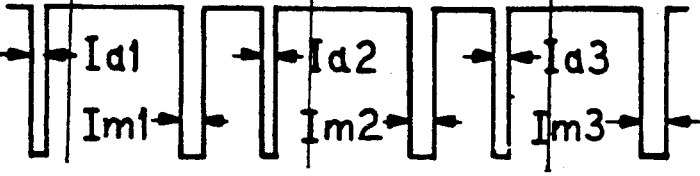

For the representative PSC motor 10 waveforms of FIG. 8a, the auxiliary winding current will pass through each zero-crossing at a faster rate than the main winding current Im so that the induced voltage spikes from the ferrite core in series with the auxiliary winding will be larger and sharper than the induced voltage spikes from the ferrite core in series with the main winding. The induced voltage spikes for the first three zero-crossings of the auxiliary winding current are shown in FIG. 8d as voltage spikes Sa1, Sa2 and Sa3. Similarly, the induced ferrite core voltage spikes for the first three zero-crossings of the main winding current are shown in FIG. 8d as voltage spikes Sm1, Sm2 and Sm3. The auxiliary and main winding currents are also shown as dashed lines in FIG. 8d. When the CW triac 31 is ON and the CCW triac 32 is OFF, voltage spikes Sm1, Sm2 and Sm3 are from ferrite core 20 and voltage spikes Sa1, Sa2 and Sa3 are from ferrite core 23. Similarly, when CCW triac 32 is ON and CW triac 31 is OFF, voltage spikes Sm1, Sm2 and Sm3 are from ferrite core 23 and voltage spikes Sa1, Sa2 and Sa3 are from ferrite core 20. The preferred part for ferrite cores 20 and 23 in this embodiment is Fair-Rite 43 Shield Bead #2643000801 manufactured by the Fair-Rite Products Corporation in Wallkill, N.Y. The smaller the inside diameter of the core 20, 23 and the longer the length of the core 20, 23 parallel to the primary winding 21, 22, respectively, the larger the magnitude of the induced voltage across the secondary winding 24. The peak magnetude of the induced voltage spikes Sm1, Sm2 and Sm3 in FIG. 8d is 40 millivolts. The cores 20 and 23 are preferably located on a printed circuit board near the current pulse circuit 40 and other electronics to avoid the use of connectors with the small voltage of the sense winding 24. However, the cores 20 and 23 may alternately be located remote from the electronics, for example, on or near the PSC motor 10.

Figure 4:
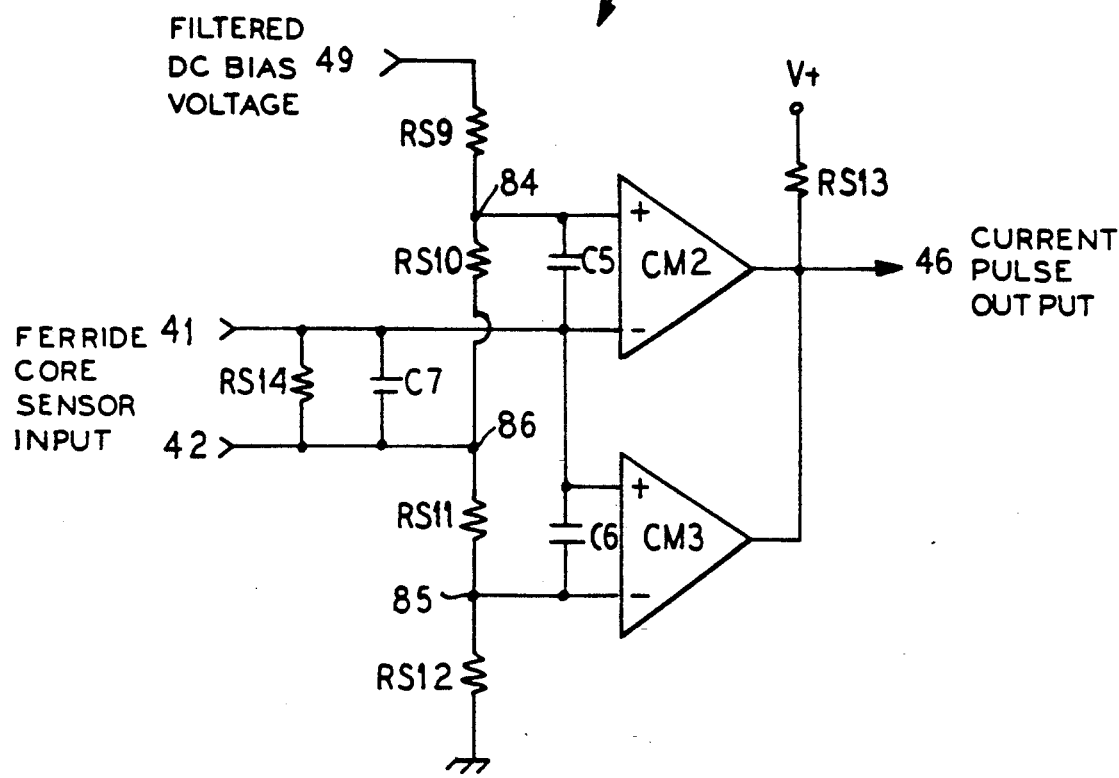

The current pulse circuit 40 as shown in FIG. 4 receives the ferrite core sense winding voltage signal as an input and provides a brief, current pulse output in response to the current zero-crossings of the primary winding of each ferrite core sensor. The current pulse train occurs at two-or four-times line frequency for the circuits of FIG. 1 with one or two ferrite core sensors, respectively, whenever the PSC motor 10 is ON. The unregulated, DC bias voltage 49 from the voltage regulator circuit adjusts the sensitivity of the combined sensor and current pulse circuity for the effect of line voltage variation on the PSC motor current. The current pulse circuit 40 uses two voltage comparators CM2 and CM3 to convert the induced voltage spikes S from the ferrite core sensors 20 and 23 to a binary current pulse output signal 46. Comparator CM2 responds to the positive induced voltage spikes S and comparator CM3 responds to the negative induced voltage spikes. The outputs of comparators CM2 and CM3 form a logical "wired OR" connection such that either comparator is capable of pulling the output signal 46 to the circuit ground, or to a logical zero state. More specifically, the output of both comparators CM2 and CM3 is connected to V+ by the pull-up resistor RS13. The unregulated DC bias voltage 49 from the voltage regulator circuit 70 is applied across the series resistor divider network comprising resistors RS9, RS10, RS11 and RS12. This has the effect of increasing the sensitivity of both comparators CM2 and CM3 when the line voltage is low and the rate of change of the motor current in the vicinity of a current zero-crossing is also low. The preferred circuit thereby compensates the combined sensitivity of the ferrite core sensors 20 and 23 and the current pulse circuit 40 for the effect of service voltage variation on the motor current. However, a resistor RS9 may also be connected to V+ if such compensation is not desired. The common connection 84 between resistors RS9 and RS10 is connected to the noninverting input of a comparator CM2. The common connection 85 between resistors RS11 and RS12 is connected to the inverting input of a comparator CM3. The common connection 86 between resistors RS10 and RS11 is connected to one end 42 of the sense winding 24 of the ferrite core sensors 20 and 23. The other end 41 of the sense winding 24 is connected to inverting input of comparator CM3 and the noninverting input of comparator CM3. Capacitor C7 is wired in parallel with the ferrite core signal 41 and 42 and is used to filter high frequency noise on the ferite core signal voltage. Much of the high frequency noise originates from the lines L1 and N and is coupled in a capacitive manner from the primary windings 21 and 22 to the secondary winding 24 of the ferrite cores 20 and 23, respectively. The use of single-turn windings 21, 22 and 24 on the ferrite cores 20 and 23 minimizes such capacitively coupled noise. A further reduction, or elimination, of this noise could be achieved through the use of nickel tape-wound cores rather than ferrite cores 20 and 23 because nickel tape-wound cores have a natural high frequency cutoff. However, the preferred circuit uses ferrite cores 20 and 23 for cost considerations.

A resistor RS14 is wired in parallel with the ferrite core signal 41 and 42 to provide a continuity path which forces the output 46 of the current pulse circuit 40 HIGH in the unlikely event that the sense winding 24 becomes open-circuited or that the terminals 41 or 42 become disconnected. The control interprets missing current pulses 46 in the same manner as the control interprets an OPEN motor thermal protector 11. Hence, a cycle will be aborted in the event that the sensor circuit becomes OPEN. Capacitors C5 and C6 filter any remaining high frequency noise across the inputs of comparators CM2 and CM3, respectively. When the voltage across inputs 41 and 42 is zero, resistors RS10 and RS11 bias comparators CM2 and CM3, respectively, such that the outputs are HIGH and the current pulse is absent. When a positive induced voltage spike S occurs, such that terminal 41 is temporarily positive with respect to terminal 42, the input voltage exceeds the DC bias voltage across resistor RS10 of comparator CM2 and the output of comparator CM2 pulls the output 46 of the current pulse circuit 40 LOW. Similarly, when a negative induced voltage spike S occurs, such that terminal 41 is temporarily negative with respect to terminal 42, the input voltage exceeds the DC bias voltage across resistor RS11 of comparator CM3, the output of the comparator CM3 pulling the output 46 of the current pulse circuit 40 LOW. Thus, the current pulse circuit 40 responds to either positive or negative induced voltage spikes from either of the ferrite core sensors 20, 23.

It will be apparent to those skilled in the art that a systematic bias could be introduced in the motor phase data from odd or even numbered line half cycles due to component differences between the resistors RS10 and RS11 or between the comparators CM2 and CM3. Similarily, a systematic bias could be introduced in the motor phase data due to occasional asymmetry in the positive and negative line half cycles due, for example, to a silicon controlled rectifier load, from another appliance, which draws power unevenly from alternate line half cycles. Rather than ignoring this potential bias, or, employing costly component matching techniques, the preferred embodiment eliminates the effect of the above systematic biases through the exclusive use of auto-referencing software programs of the microcomputer 50 which either use sufficient data memory to make motor phase comparisons without mixing data from odd and even numbered line half cycles or which make decisions from data which include an equal number of motor phase samples from positive and negative line voltage half cycles. The output 46 of the current pulse circuit 40 is supplied to the microcomputer 50 as an interrupt to initiate a timing procedure or to read the present value of the timer of the microcomputer on the leading edge of a current pulse. A pulse train of induced ferrite core voltage spikes Sa and Sm and corresponding current pulses Ia and Im are shown graphically in FIG. 8d and 8e, respectively.

The watchdog circuit 90 is shown in FIG. 5. The watchdog circuit provides a hard-wired RESET signal to the microcomputer 50 whenever the microcomputer 50 fails to echo the volt pulse signal 45 to the watchdog circuit 90 for a preset period of time. The watchdog circuit 90 also resets the microcomputer 50 during the initial powerup period. More specifically, input 55 to the watchdog circuit 90 is a dedicated status output from the microcomputer 50 which is HIGH whenever the microcomputer is being RESET and LOW at all other times in accordance with the software of the microcomputer 50. All outputs of the microcomputer 50 including output line 55 are HIGH whenever the microcomputer is RESET. The resistor RS22 is a pull-up resistor at the output of the comparator CM4 for the RESET signal 57 to the microcomputer 50. The microcomputer 50 is being RESET when the comparator CM4 output 57 is LOW. The resistor RS19 is a pull-up resistor for the status input 55. When the microcomputer 50 is being RESET, the status input 55 is HIGH and the capacitor C8 charges toward V+ through resistors RS15 and RS19. At all other times the status input 55 is LOW and the capacitor C8 is discharging toward circuit ground through the resistor RS15. The common connection 91 between the resistor RS15 and the capacitor C8 is wired to the noninverting input of the comparator CM4 and the cathode of the diode D4. The voltage divider formed by the resistors RS16 and RS17 defines a DC voltage threshold at the inverting input 92 of the comparator CM4. The resistor RS18 is connected from the status input 55 to the inverting input 92 of the comparator CM4. The resistor RS18 provides feedback to ensure overall stability of the circuit 90 when the RESET signal 57 is removed and the microcomputer status input goes from HIGH to LOW. The capacitor C9 is connected from the volt pulse echo input 56 to the anode of diode D4. The resistor RS20 is a pullup resistor for the microcomputer 50 volt pulse echo output 56. A current path from the connection 94 between the capacitor C9 and the diode D4 to circuit ground is provided by the resistor RS21.

Under normal operating conditions a volt pulse train 45 comprising 120 volt pulses per second is received by the microcoputer 50 and in response thereto the microcomputer 50 echos the volt pulse 45 to the watchdog circuit 90 via watchdog circuit input 56. Energy from the positive voltage transition at the trailing edge of each volt pulse echo signal is coupled through the capacitor C9 and the diode D4 to charge capacitor C8. Should either the volt pulse circuit 45 or the microcomputer 50 become inoperative, the volt pulse echo signal will remain either in the HIGH or the LOW state and the capacitor C8 will discharge through the resistor RS15 to ground. When the voltage at the noninverting input 91 of the comparator CM4 drops below the DC threshold voltage at the inverting input 92, the comparator CM4 output will switch from HIGH to LOW and a RESET signal 57 will be sent to the microcomputer 50. If the washing machine is operating in a clothes washing cycle, the cycle will be aborted. Upon recognizing receipt of a RESET signal, all microcomputer 50 output lines, including the watchdog status input 55, will go HIGH, and, the capacitor C8 will charge toward V+ through the resistors RS15 and RS19. The feedback resistor RS18 provides a somewhat higher DC threshold at the inverting input 92 of the comparator CM4. When the capacitor C8 has charged sufficiently to cause the voltage at the noninverting input 91 of the comparator CM4 to exceed the DC threshold 92 at the inverting input, the comparator CM4 output goes LOW; the status input 55 of the microcomputer 50 to the watchdog circuit 90 goes LOW via microcomputer 50 software; and microcompouter 50 is restored to normal operation. A wash cycle begins the next time that the user presses a start button 612 or a cycle selection button 603, 605, 607. On initial powerup the status input 55 is HIGH and the comparator CM4 output 57 remains LOW until the capacitor C8 has charged sufficiently to cause the voltage at the noninverting input 91 to the comparator CM4 to exceed the DC threshold 92 at the inverting input. Hence, the microcomputer 50 will be RESET on powerup.

Figure 6:
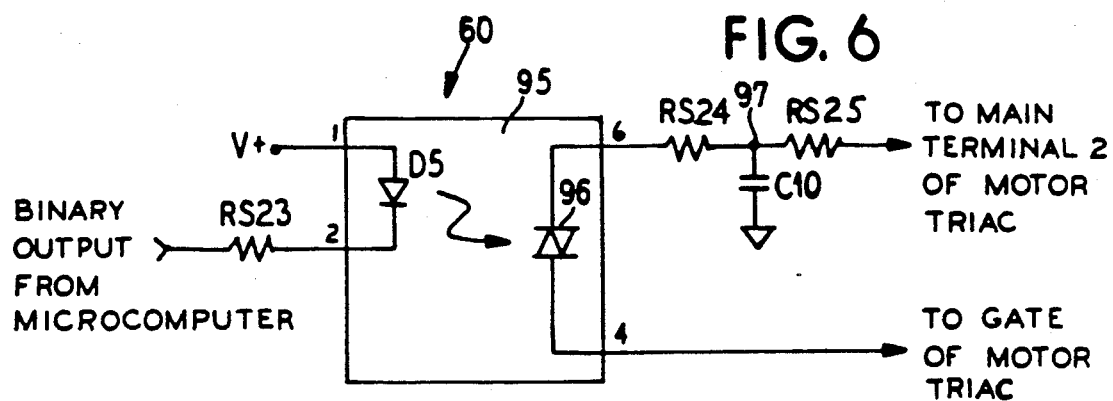

The triac driver circuit 60, 61, 62 is shown in FIG. 6. The preferred circuit uses an optically isolated triac driver integrated circuit 95 to provide a signal to trigger a large motor triac 31, 32, 33 from a small binary microcomputer output signal while maintaining electrical isolation of the microcomputer circuitry from the line voltage. More specifically, the preferred circuit uses a MCP 3011 optically isolated triac driver IC that contains a light emiting diode D5 and a small phototriac 96. The anode of the light emiting doide D5 is connected to V+ and the cathode of D5 is connected to a resistor RS23 which is driven by a binary output from microcomputer 50. The phototriac 96 is connected from the gate of a motor triac 31, 32, 33 to the second main terminal MT2 of the same motor triac 31, 32, 33 via resistors RS24 and RS25. A capacitor C10 is wired from the common connection 97 of resistors RS24 and RS25 to line L1 of the line voltage. A capacitor C10 provides a snubbing circuit for both the phototriac 96 and the motor triac 31, 32, 33 via resistors RS24 and RS25, respectively. The snubbing circuit limits the rate of change of voltage across both the phototriac 96 and the motor triac 31, 32, 33 and thereby avoids spurious activation of either triac in the absense of light energy from the diode D5. More, specifically, when the binary output from the microcomputer 50 is HIGH, the diode D5 is not forward biased, no light energy passes to the phototriac 96, the phototriac 96 is in the OFF or blocking state and the motor triac 31, 32, 33 is not triggered. When the binary output from the microcomputer 50 is LOW the diode D5 is forward biased, light energy passes from the light emiting diode D5 to the phototriac 96, the phototriac 96 is triggered ON, a circuit is completed from the second main terminal MT2 to the gate of the motor triac 31, 32, 33 via resistors RS24 and RS25 to trigger the motor triac 31, 32, 33.

Figure 7:
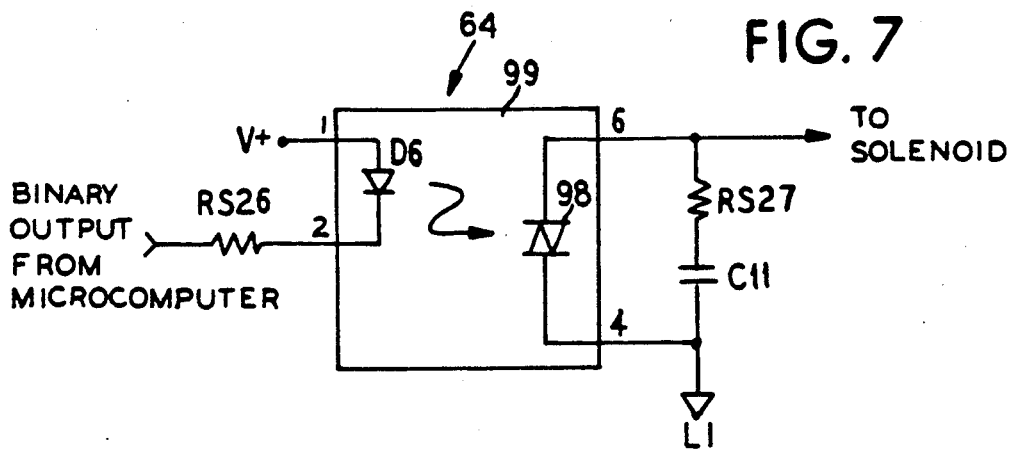

The solenoid driver circuit 64 is shown in FIG. 7. The preferred circuit uses an optically isolated triac driver integrated circuit 99 to directly drive a small AC solenoid load from a small binary output signal of the microcomputer 50 while maintaining electrical isolation of the microcomputer circuitry from the line voltage. More specifically, the preferred circuit uses a MCP 3011 optically isolated triac driver IC which contains a light emiting diode D6 and a small phototriac 98. The anode of the light emiting doide D6 is connected to V+ and the cathode of the diode D6 is connected to the resistor RS26 which is driven by a binary output from microcomputer 50. The phototriac 98 is connected from the line L1 of the line voltage to the solenoid load. A snubber circuit comprising a series resistor RS27 and the capacitor C11 is wired in parallel with the phototriac 98 to limit the rate of change of voltage across the phototriac 98 and thereby avoid spurious activation of the phototriac 98 in the absense of light energy from the diode D6. When the binary output from the microcomputer 50 is HIGH, the diode D6 is not forward biased, no light energy passes to the phototriac 98, the phototriac 98 is in the OFF or blocking state and the solenoid load is OFF. When the binary output of the microcomputer 50 binary output is LOW the diode D6 is forward biased, light energy passes from the light emiting diode D6 to the phototriac 98; the phototriac 98 is triggered ON and the solenoid load is energized.

Although the values of the components shown in FIG. 2, 3, 4, 5, 6 and 7 may be selected to meet individual circuit requirements in a manner known to those skilled in the art without departing from the inventive concept disclosed herein, an exemplary embodiment of these circuits can be realized wherein the comparators CM1, CM2, CM3 and CM4 are each one-quarter of an LM339 quadruple comparator package; the voltage regulator integrated circuit 71 is a 7805 five volt regulator IC; the triac and solenoid driver circuits 60 and 64 use MCP3011 optically isolated triac driver integrated circuits; and wherein the remaining components have the following values:

| COMPONENT | VALUE(OHMS/MICROFARADS) |
|---|---|
| RS1 | 1.2K |
| RS2 | 1K |
| RS3 | 100K |
| RS4 | 24K |
| RS5 | 10K |
| RS6 | 100K |
| RS7 | 680K |
| RS8 | 5.6K |
| RS9 | 10K |
| RS10 | 12 |
| RS11 | 12 |
| RS12 | 10K |
| RS13 | 5.6K |
| RS14 | 100 |
| RS15 | 100K |
| RS16 | 3.9K |
| RS17 | 1K |
| RS18 | 10K |
| RS19 | 6.8K |
| RS20 | 3.3K |
| RS21 | 1.5K |
| RS22 | 5.6K |
| RS23 | 330 |
| RS24 | 180 |
| RS25 | 100 |
| RS26 | 330 |
| RS27 | 180 |
| C1 | 1500 |
| C2 | 33 |
| C3 | 0.02 |
| C4 | 0.0047 |
| C5 | 0.01 |
| C6 | 0.01 |
| C7 | 0.68 |
| C8 | 0.47 |
| C9 | 0.15 |
| C10 | 0.02 |
| C11 | 0.01 |

WASHING MACHINE OPERATIONS

Figure 10:
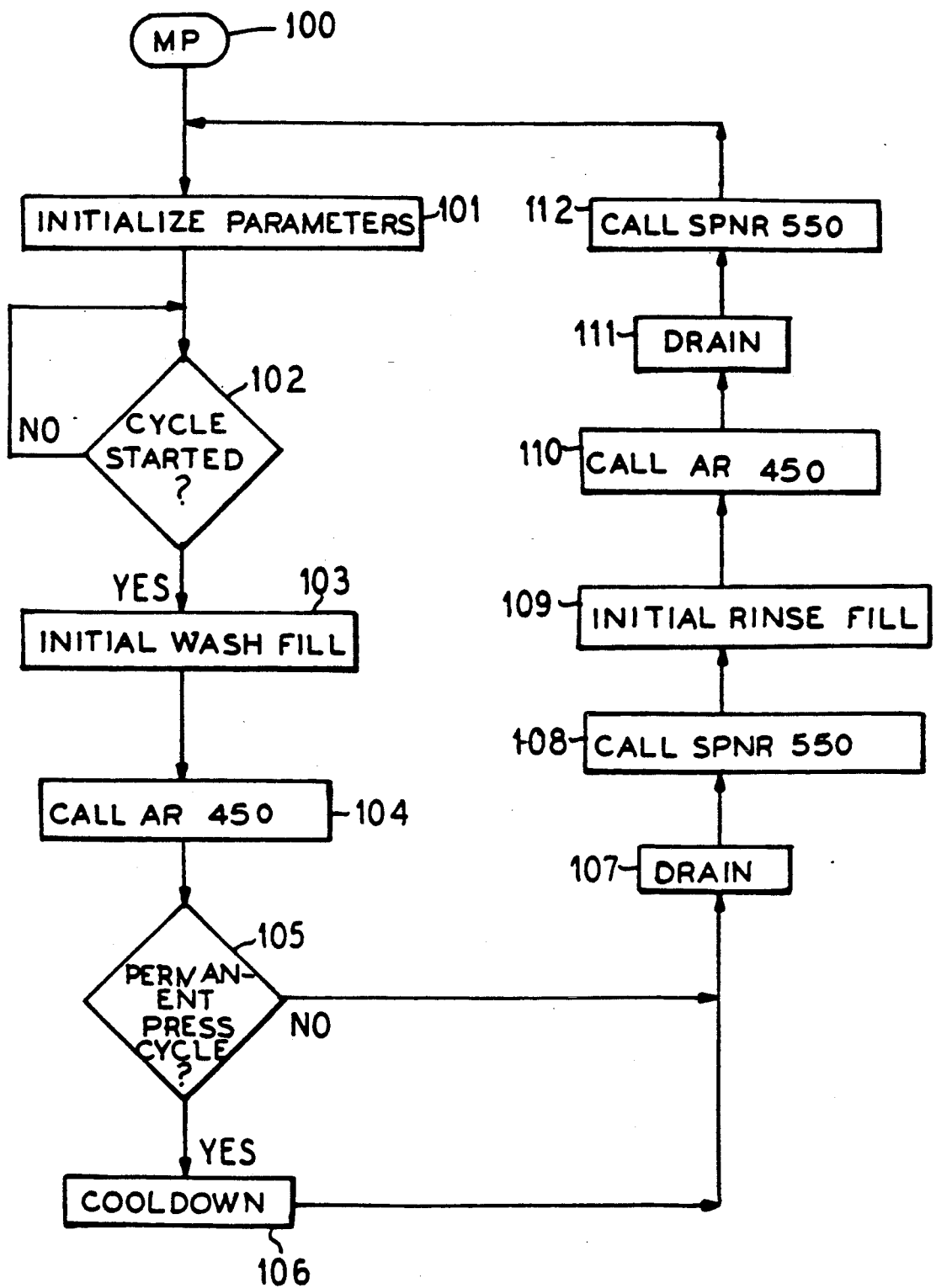
FIG. 10 is a flow chart illustrating the main program MP for an automatic washing machine.

The flow chart for main program MP 100 is shown in FIG. 10. The main program MP executes a cycle for the automatic washing machine 600 having a reversing PSC motor 10. The main program MP 100 initializes parameters; waits for the user to start a cycle; provides an initial water fill, a wash agitation period, a cooldown period in permanent press cycles, initial drain and spin extraction periods, an initial deep-rinse water fill, a deep-rinse agitation period and final drain and spin extraction periods. More specifically, the main program MP 100 initializes parameters in program step 101 including program code which drives the microcomputer 50 status output line 55 LOW to terminate the initial RESET in response to the power-up signal 57 from the watchdog circuit 90. The main program MP 100 then loops repeatedly through the program decision step 102 until the user has initiated a cycle. The user initiates a cycle by pressing an appropriate button associated with a binary input 54 to the microcomputer 50, such as the start button 612 or one of the normal, permanent press or delicate cycle selection buttons 603, 605, 607. Hence, whenever the washing machine 600 has completed one cycle and is waiting for the user to initiate the next cycle, the main program MP 100 is looping through the decision step 102.

Upon user actuation of any cycle, the program advances to step 103 at which time the washing machine 600 provides an initial wash water fill to a minimum safe water level for clothes agitation to begin. With a true automatic water level control there is no user input regarding the size of the clothes load or the desired water level and the washing machine fills to about half of the maximum water level in step 103. However, in the preferred embodiment, the user has the option of selecting any one of five water levels via one or more buttons 614 to dictate the minimum amount of water that the washing machine 600 uses for the present cycle in which case the washing machine 60 fills to the user selected water level at step 103. As discussed in detail below, the control may override the user water level selection and add additional water to the wash or deep-rinse agitation procedure. However, the control never uses less than the amount of water specified by the user. After filling to the initial wash water level in step 103 the main program MP 100 calls the agitate routine AR 450 a first time to provide automatic control and adjustment of the wash agitation period, wash water level, agitation stroke angle and agitation time as per the size and the selected type of clothes load and the selected water temperature.

More particularly, when the agitate routine AR 450 is called, the microcomputer 50 controls the PSC motor 10 to drive the agitator through twenty strokes, ten clockwise strokes and ten counterclockwise strokes. For each stroke the microcomputer activates a triac 31, 32 cycling on the PSC motor 10 to drive the agitator in either the clockwise or counterclockwise direction. After activating one of the triacs 31, 32, the microcomputer 50 calls the motor start routine 200 to determine when the motor reaches operating speed based on the characteristic increase in the lagging phase angle of the motor. At this point, the powered portion of the agitator stroke has begun. After determining the motor start time, the microcomputer 50 returns to the agitate routine AR 450 to call the stroke routine SR 350. The stroke routine SR 350 is called by the microcomputer 50 to complete the powered portion of the agitator stroke. The microcomputer 50 when operating in accordance with the stroke routine SR 350 computes the remaining time for the powered portion of each stroke to provide the optimal stroke angle for the size of the clothes load as indicated by the residual pulse count determined from the previous stroke, the water level and the user selected cycle parameter. For a given cycle parameter, the larger the size of the clothes load as indicated by a small residual pulse count, the greater the stroke angle. Further, for a given size load, the stroke angle for a delicate cycle is smaller than the stroke angle for a permanent press cycle and the stroke angle for a permanent press cycle is smaller than the stroke angle for a normal cycle. Upon completing the powered portion of the stroke, the microcomputer 50 returns from the stroke routine SR 350 to the agitate routine AR 450 with the motor 10 cycled off When the microcomputer 50 returns to the agitate routine 450 with the motor 10 cycled off, the microcomputer 50 calls the residual pulse count routine RPCR 400 to determine the duration of he residual current flowing through the motor windings. Thereafter the microcomputer 50 initiates a stroke in the opposition direction.

After twenty strokes are completed, the microcomputer 50 determines whether the water level has reached the maximum water level. If the maximum water level has not been reached, the microcomputer 50 determines whether more water needs to be added based upon the size of the load, i.e., the residual pulse count. The microcomputer 50 then determines whether to agitate or not while increasing the water level. If the water level is grossly insufficient as determined by the residual pulse count, the microcomputer will increase the water level by a predetermined amount without agitation. Otherwise, water will be added while agitating. After the maximum water level has been reached, the microcomputer 54 monitors the residual pulse count to determine whether an overload condition exists and if so, actuates an overload display 610 on the washing machine 600 and sets a flag to limit the stroke angle for the remainder of the cycle. After the maximum water level has been reached, the microcomputer 50 calls the agitate time routine ATR 300 to compute the duration of the agitation period. If the agitation period has not expired, more agitation strokes are performed as discussed above until the agitation period has expired, at which time the microcomputer 50 returns to the main program.

After returning to the main program from the agitation routine AR 450, the microcomputer 50 at steps 105 and 106 provides a cooldown period in the permanent press cycle. The cooldown period typically involves draining to a preset water level, refilling to the wash water level with cold water, and, provding sufficient clothes agitation to achieve a uniform wash bath temperature. The main program MP 100 than provides a complete drain 107 with the pump motor 16 in all cycles prior to any spin extraction. The main program MP 100 then calls the spin routine SPNR 550 a first time in step 108. The spin routine SPNR 550 provides a spin extraction period of appropriate duration for the size and selected type of clothes load.

More particularly, when the microcomputer 50 calls the spin routine 550, the CCW triac 32 is turned on and the motor start routine 200 is called to determine when the motor is up to speed, i.e., the motor start time. The microcomputer 50 determines the duration of the spin routine in accordance with the motor start time and the selected cycle parameter indicating a normal, delicate or permanent press cycle. For example, if the motor start time is long indicating a large inertial load, the microcomputer 50 provides a longer spin time than if the motor start time were short indicating a small initial load. The duration of the spin time is further longer for a normal load than for a permanent press load, the spin duration of which is longer than the spin duration for a delicate cycle. After computing the remaining amount of spin time, the microcomputer 50 calls an off balance routine 500 to compute the amount of dither in the PSC motor 10 for the purpose of detecting a spin off balance. In order to compute the amount of dither, the microcomputer utilizes an auto-referencing technique which compares samples of the lagging phase angle of the PSC motor 10 taken from either the positive or negative line half cycles. More particularly, a sum is accumulated in a register which represents the difference between each of a predetermined number of lagging phase angles sampled during either a positive or a negative half cycle. If the sum is equal to zero, no dither is present. However, if the sum is not equal to zero, the sum represents the cumulative motor phase dither. The motor phase dither is sampled for a preset period of time after which the accumulated sum is compared to a threshold value to determine whether an off balance condition exists. If an off balance condition does exist, at the end of the sample period the PSC motor 10 is turned off. After completing the spin routine, the microcomputer 50 returns to the main program with the wash fill, wash agitation, drain and spin extraction periods completed.

The main program, in step 109, then provides an initial deep-rinse fill with cold water to the same water level as had occured during the wash agitation period. The main program than calls the agitate routine 450 a second time in step 110 to provide automatic control and adjustment of the deep-rinse agitation period, deep-rinse water level, agitation stroke angle and agitation time as per the size and type of the clothes load. Deep-rinse agitation times are about four times shorter than wash agitation times. Deep-rinse water levels are occasionally higher than the wash water levels because cold water causes the agitator blades to stiffen thereby increasing the load torque to the PSC motor 10. All the water is drained in step 111 as previously in step 107. The main program MP 100 than calls the spin routine SPNR 550 a second time in step 112. As before, the spin routine SPNR 550 provides a spin extraction period of appropriate duration for the size and type of the clothes load. Following completion of the final spin extraction in step 112, the program loops back to step 101 to re-initialize parameters and at step 102 to wait for user initiation of the next cycle.

The following table represents the contents of various registers of the microcomputer 50 utilized during the implementation of the flow charts shown in FIGS. 11–19 as discussed in detail below.

| DATA MEMORY REGISTER ALLOCATION TABLE | |
|---|---|
| REGISTER | DATA |
| R1 | Agitation time |
| R2 | Automatic water level control (AWLC) time |
| R3 | Stroke count |
| R4 | Sum of residual pulse count |
| R5 | Residual pulse count |
| R6 | Computed optimal wash or rinse agitation time |
| R7 | Cumulative motor phase dither |
| R8 | Sum of the last two consecutive lagging motor phase numbers |
| R9 | Last lagging motor phase number |
| R10 | Second last lagging motor phase number |
| R11 | Third last lagging motor phase number |
| R12 | Fourth last lagging motor phase number |
| R13 | Fifth last lagging motor phase number |
| R14 | Sixth last lagging motor phase number |
| R15 | Seventh last lagging motor phase number |
| R16 | Eighth last lagging motor phase number |
| R17 | Ninth last lagging motor phase number |
| R18 | Motor start time |
| R19 | Minimum sum of two consecutive lagging motor phase numbers |
| R20 | Computed motor start threshold |
| R21 | Cycle parameter |
| R22 | Dither sample time |

A flow chart for the lagging phase monitoring routine LPMR 150 is shown in FIG. 11. The lagging phase monitoring routine LPMR 150 is called by the motor start routine MSR 200, the stroke routine SR 350 and the off-balance routine OBR 500. The lagging phase monitoring routine LPMR 150 is called to sample the main winding phase angle of the PSC motor 10 when the PSC motor 10 is ON; or to delay one line half cycle when the PSC motor 10 is OFF. The lagging phase monitoring routine LPMR 150 may be called as often as one time for each line voltage half cycle or 120 times per second for a 60 Hz line voltage. More specifically, the lagging phase monitoring routine LPMR 150 delays at decision step 151 until the volt pulse is gone. The lagging motor phase angle is the time from the leading edge of the volt pulse to the leading edge of the lagging current pulse as shown graphically in FIG. 8c and 8d. Program step 151 gaurantees that this timing procedure will not inadvertantly begin in the middle of a volt pulse. After falling through decision step 151, the program loops through decision step 152 until the arrival of the leading edge of the next volt pulse. The timer of the microcomputer 50 is started via an interrupt routine in program step 15 and the microcomputer 50 drives the volt pulse echo output line 56 to the watchdog circuit 90 LOW in step 154. The program than loops through decision step 155 until the volt pulse is gone whereupon the volt pulse echo output line 56 is allowed to go HIGH signaling to the watchdog circuit 90 that the volt pulse circuit 70 and the microcomputer 50 are functioning in a normal manner. Program control is then returned to the calling program via decision step 157 and step 158 if the PSC motor 10 is OFF; otherwise, the program falls through to decision step 159.

The program then loops through decision steps 159 and 160 until either a current pulse arrives or a preset time limit expires. If a preset time limit expires before the arrival of a current pulse as would be the case with an OPEN motor overload protector 11, program control is returned to the calling program via step 161; otherwise, the program advances to step 162 upon the arrival of the leading edge of the next main winding current pulse as is shown graphically in FIG. 8e. At program step 162 the value of the timer of the microcomputer 50 at the leading edge of the current pulse is read via an interrupt routine and the elapsed time from the leading edge of the volt pulse to the leading edge of the current pulse is stored in register R9 for the use of the calling program. Program control is then returned to the calling program in step 163 with the main winding lagging PSC motor 10 phase number in register R9. The actual motor phase number requires two 8-bit data bytes. However, the program steps that are required to manipulate data requiring more than one 8-bit data byte are well known to those skilled in the art and will be omitted from this and all subsequent flow charts to avoid unnecessary complexity.

Figure 12:
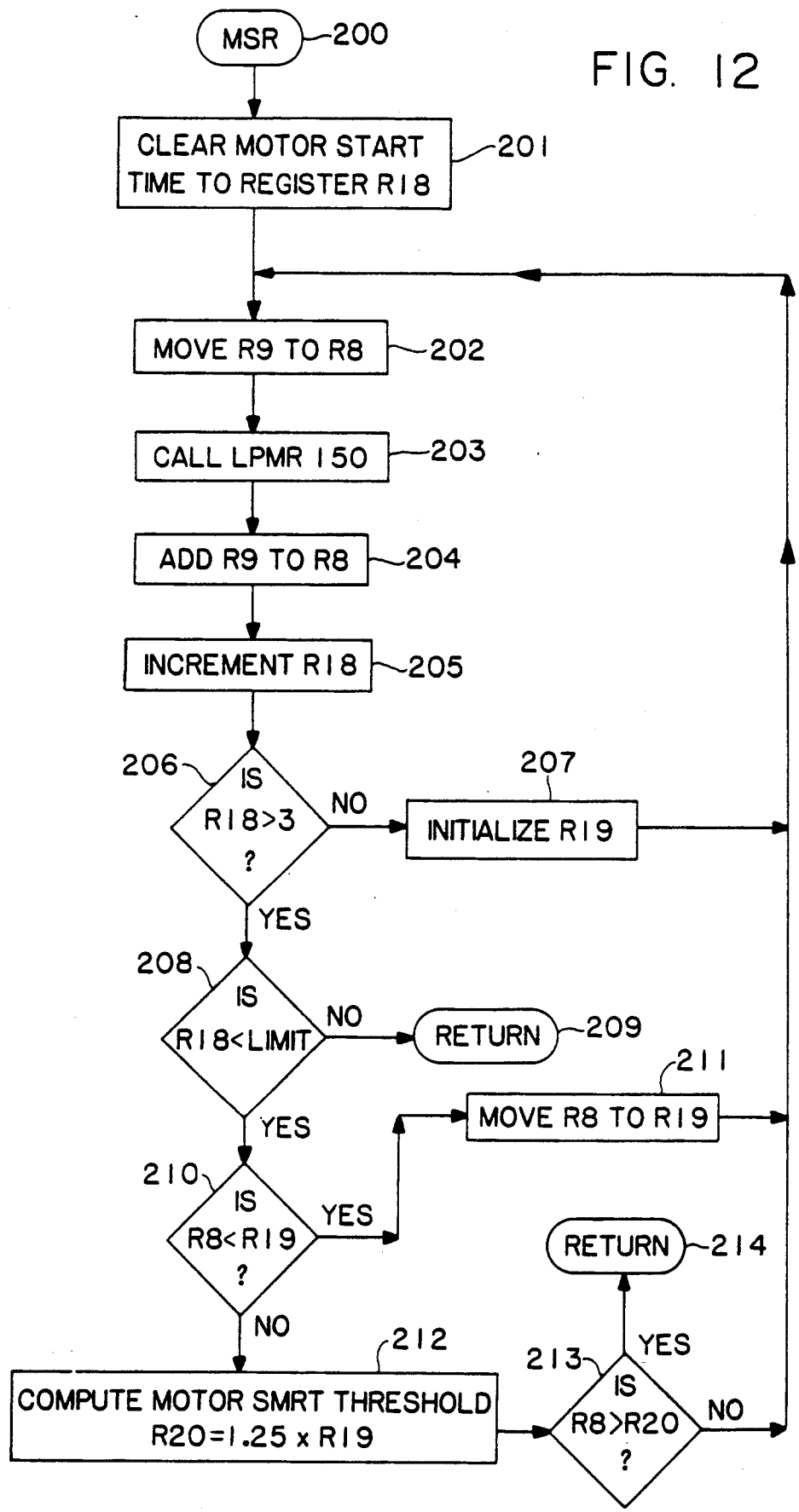
FIG. 12 is a flow chart illustrating the PSC motor start routine MSR.

A flow chart for the motor start routine MSR 200 is shown in FIG. 12. The motor start routine MSR 200 is called by the agitate routine AR 450 to monitor the motor start time for each CW and CCW agitator stroke. The motor start routine MSR 200 is also called by the spin routine SR 550 to monitor the time required for the PSC motor 10 to accelerate the spin basket. The motor start routine MSR 200 calls the lagging phase monitoring routine LPMR 150 and uses a software auto-referencing technique to monitor a characteristic percentage increase in the lagging main winding phase numbers of the PSC motor 10 which occurs when the PSC motor 10 is fully accelerated. PSC motor start times are generally brief during motor starting for each CW and CCW agitator stroke, and, much longer for spin basket acceleration. Software auto-referencing techniques eliminate the need for costly individual factory or field calibration of each washing machine 600.

More specifically, the motor start routine MSR 200 begins by clearing the motor start time register R18 in step 201. The last lagging motor phase number in register R9 is moved to register R8 in step 202. The lagging phase monitoring routine LPMR 150 is called in step 203. The lagging phase monitoring routine LPMR 150 returns to the motor start routine MSR at step 204 with the last main winding lagging motor phase number in register R9. In step 204 the sum of the last two consecutive lagging motor phase numbers is computed and stored in register R8. Thus, register R8 contains motor phase data from one positive and one negative line voltage half cycle, thereby eliminating systematic bias due to possible line voltage or circuitry asymmetry on odd or even numbered line half cycles.

Program step 205 increments the motor start time in register R18. Decision step 206 forces the program to take the path through step 207 and back to step 202 on the first four passes. This defines a minimum PSC motor 10 start time of five line half cycles, and, provides sufficient time for good data to be accumulated over the last two consecutive motor phase samples. It is noted that on the first pass through step 202, the register R9 contains meaningless information. The register R19 is used throughout the motor start routine to store the minimum sum of two consecutive lagging motor phase numbers. The register R19 is initialized to an excessively large value on each pass through step 207 during the initial portion of the motor start procedure. Beginning with the fourth pass, the program falls through decision step 206 to decision step 208. Decision step 208 defines a maximum motor start time limit. This is necessary because a combination of low line voltage and a large clothes load can cause a situation wherein the PSC motor 10 never fully accelerates to a normal run speed. The time limit in decision step 208 is varied depending upon whether the PSC motor is in the agitate or spin mode since spin basket acceleration times are considerably longer than the acceleration times or motor start times during clothes agitation. If the time limit in decision step 208 is exceeded, the program control is returned to the calling program in step 209; otherwise, the program falls through decision step 208 to decision step 210. Decision step 210 compares the sum of the last two consecutive lagging motor phase numbers in register R8 to the previous minimum sum of two consecutive lagging motor phase numbers in register R19. A new minimum is always found on the first pass through decision step 210 because register R19 has previously been initialized to an excessively large number. If a new minimum sum of two consecutive laging motor phase numbers is found, the new number is moved to register R19 in step 211 and the program loops back to step 202 to prepare for the next motor phase sample; otherwise, the program falls through to step 212. Program steps 212 and 213 perform a test to determine whether or not the PSC motor 10 has started. Step 212 computes a motor start threshold in register R20. The motor start threshold is 1.25 times the minimum sum of two consecutive lagging motor phase numbers stored in register R19. The required motor start threshold is preferably computed by moving a copy of register R19 to register R20; dividing register R20 by two; and dividing register R20 by two once again so that the number now in register R20 is the value of R19 divided by four. Finally, the number in register R19 is added to the number in register R20. The desired motor start threshold is now in register R20 and the original number stored in register R19 is unaffected. Decision step 213 compares the sum of the last two lagging motor phase numbers in register R8 to the motor start threshold in register R20 and returns to the calling program via step 214 with the PSC motor 10 fully started and the motor start time in register R18 if the value in register R8 is larger than the threshold in R20; otherwise, the program loops back to step 202 to prepare for the next lagging motor phase sample.

Figure 13:
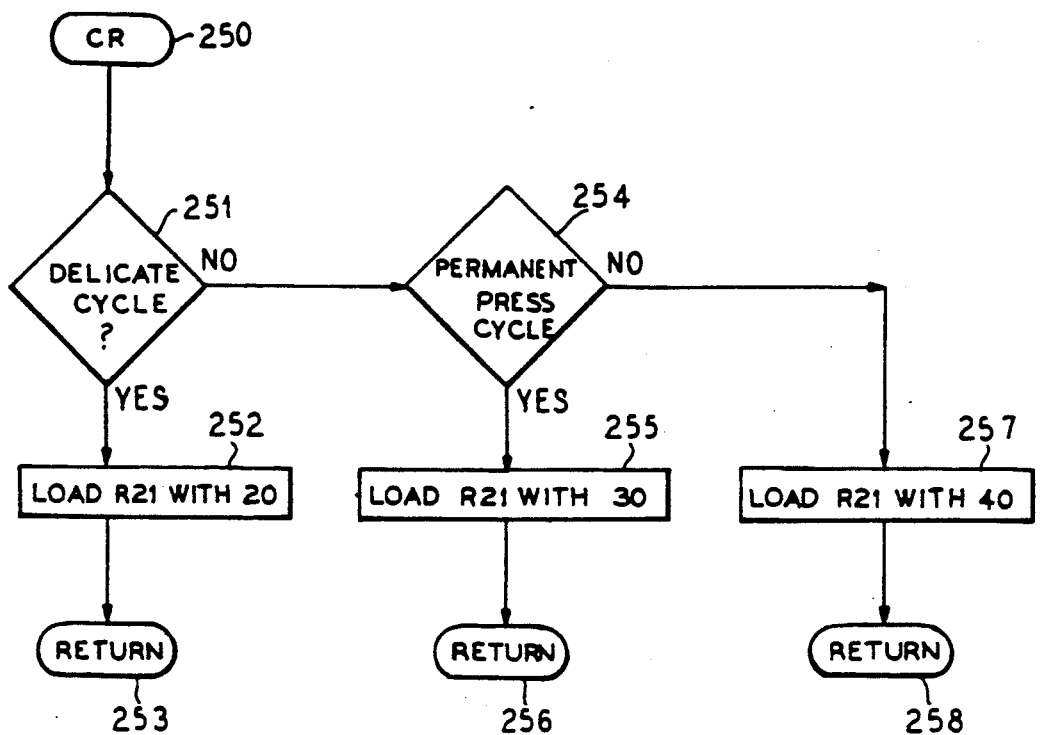
FIG. 13 is a flow chart illustrating the cycle routine CR.

A flow chart for the cycle routine CR 250 is shown in FIG. 13. The cycle routine CR 250 defines a parameter in microcomputer 50 data memory register R21 in accordance with the present user cycle selection. The cycle routine CR 250 is called by the agitate time routine ATR 300, the stroke routine SR 350 and the spin routine SR 550 for the purpose of automatically adjusting the wash or deep-rinse agitation time, the CW or CCW stroke angle or the spin extraction time, respectively, in accordance with the user cycle selection. The user may change the cycle selection at any time before initiating a cycle or during a cycle. More specifically, the cycle routine CR 250 interrogates a binary input 54 or a data memory flag set upon the previous momentary touching of a console button 603, 605, 607 to determine whether the last user cycle selection was for the delicate cycle in step 251. If the delicate cycle is selected, the program falls through to step 252 whereupon data memory register R21 is loaded with twenty and program control is returned to the calling program in step 253; otherwise, the program advances to decision step 254. Similarly, decision step 254 interrogates a binary input 54 or a data memory flag set upon the previous momentary touching of a cosole button to determine whether the last user cycle selection was for the permanent press cycle. If the permanent press cycle is selected the program falls through to step 255 whereupon data memory register R21 is loaded with thirty and the program control is returned to the calling program in step 256; otherwise, it is assumed that a normal, i.e., cotton cycle is selected and data memory register R21 is loaded with forty in step 257 and program control is returned to the calling program in step 258.

Figure 14:
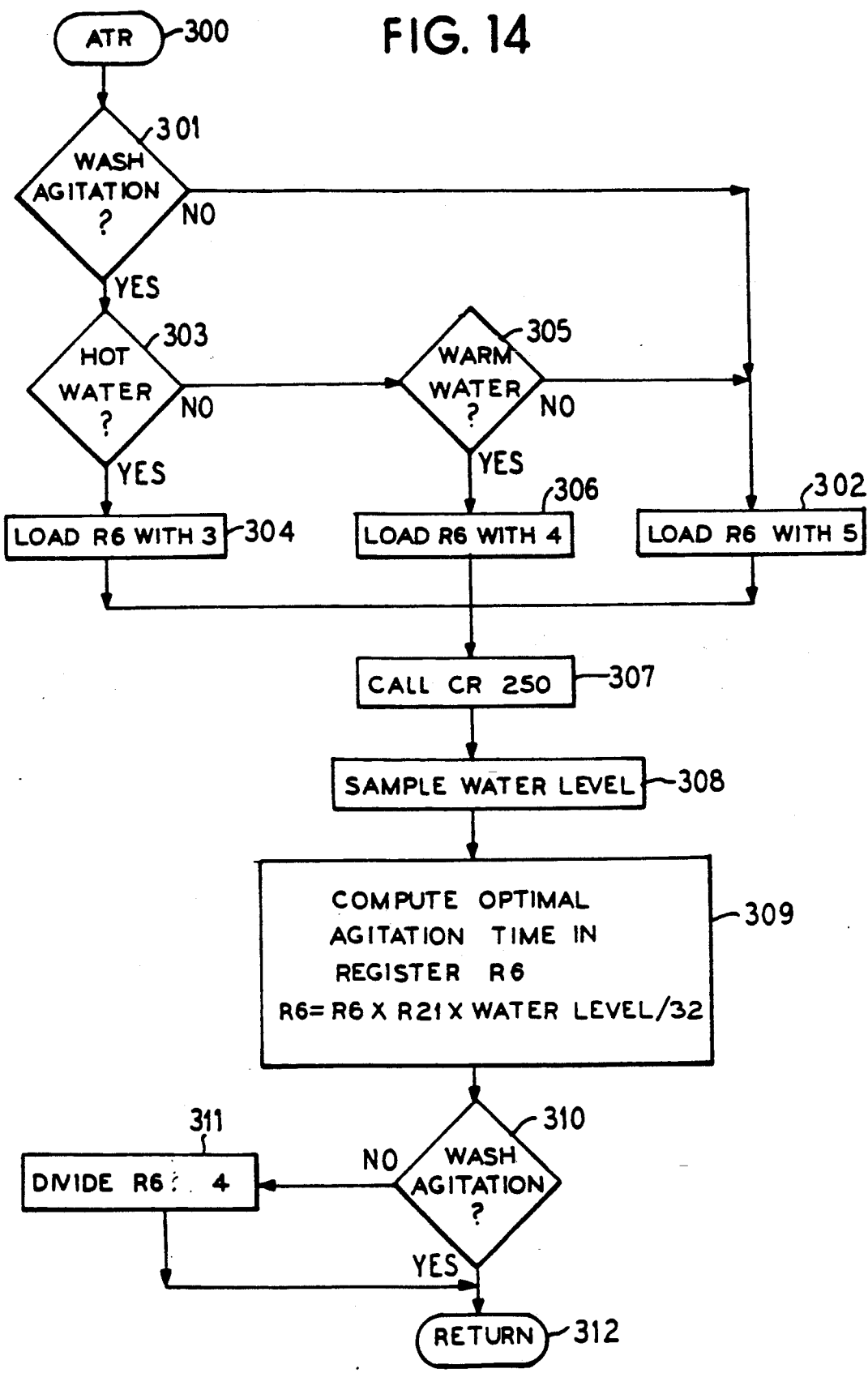
FIG. 14 is a flow chart illustrating the agitate time routine ATR.

A flow chart for the agitate time routine ATR 300 is shown in FIG. 14. The agitate time routine ATR 300 is called by the agitate routine AR 450 to determine the optimal amount of time for agitation during wash and deep-rinse clothes agitation periods in accordance with the water temperature selection, the user cycle selection and the size of the clothes load, i.e., the water level. More specifically, the agitate time routine ATR 300 uses decision step 301 to loop down to step 302 during deep-rinse agitation when cold water is always used. During wash agitation, the program falls through decision step 301 to decision step 303. Decision step 303 loads data memory register R6 with three if hot wash water has been selected by the user; decision step 305 loads register R6 with four if warm wash water has been selected by the user; otherwise, cold wash water is assumed so that register R6 is loaded with five. The program now calls the cycle routine CR 250 at step 307. The cycle routine CR 250 returns with twenty, thirty or forty in register R21 depending upon whether the delicate, permanent press or normal cycle has been selected. The water level is sampled in step 308. The preferred analog water level transducer is a pressure to frequency transducer. Water level measurements are made by the microcomputer 50 sampling the frequency of a square wave binary input 54 and using an algorithm or lookup table to convert the measured frequency to a particular water level. This procedure is known to those skilled in the art. For the purpose of this disclosure it will be assumed that the water level sample has been converted to a number from five to ten where five represents a minimum water level and ten represents the maximum water level. The optimal wash agitation time is computed in a data memory register R6 in step 309. The computed value of the wash agitation time in register R6 is equal to the old value of R6, times the value of register R21, times the water level and divided by thirty-two. Steps 310 and 311 further divide the result in register R6 by four for the deep-rinse agitation period so that the deep-rinse agitation time will be approximately four times less than the wash agitation time. This is approximate because the CW and CCW stroke time may change due to a change in the water temperature from the wash to the deep-rinse agitation periods. The agitate time routine ATR 300 returns to the agitate routine AR 450 at step 312 with the computed optimal agitation time in register R6.

A flow chart for the stroke routine SR 350 is shown in FIG. 15. The stroke routine SR 350 is called by the agitate routine AR 450 once for each CW or CCW agitator stroke. The stroke routine SR 350 is called immediately after the PSC motor 10 is started to complete the powered portion of the stroke in accordance with the size of the clothes load and the user cycle selection. The stroke routine SR 350 uses the residual pulse count data from the previous stroke and the motor start time from the present stroke to compute the remaining time for the powered portion of the present stroke and then times out the powered portion of the present agitator stroke. The net effect of the stroke routine SR 350 is to provide the optimal stroke angle for the present clothes load, water level and user cycle selection.

More particularly, the microcomputer 50 at step 361 determines whether the overload flag is set and if so, the microcomputer 50 at step 363 sets the register R21 equal to 24 to limit the duration of the agitator strokes for the remainder of the present cycle. If the overload flag is not set, the microcomputer 50 calls the cycle routine CR 250 at step 351. The cycle routine CR 250 returns to the stroke routine SR at step 352 with twenty, thirty or forty loaded in data memory register R21 for user selected delicate, permanent press or normal cycles, respectively. The stroke routine SR 350 uses data memory register R21 to compute the remaining time for the present agitator stroke. A program loop comprising steps 352, 353 and 354 is used to increase the remaining stroke time in register R21 in accordance with the residual pulse count from the most previous agitator stroke in register R5. At the time that the stroke routine SR 350 is called, the number in register R5 is a number from one to four which is highly correlated with the size of the clothes load. For a large clothes load register, R5 is one and for a very small clothes load, register R5 is four or more. The program loop of steps 352, 353 and 354 causes an increase in the duration of the powered portion of the present agitator stroke if data from the most previous agitator stroke indicates that the clothes load is large. Specifically, the residual pulse count in register R5 is incremented at step 352. The program falls through decision step 353 if the value of register R5 is five or more; otherwise, step 354 adds four units to the present value of register R21 and loops back to step 352. The powered portion of the present agitator stroke, hence, the stroke angle, is increased every time that the program loops through step 354. Program steps 355 and 356 take into account the amount of time that was required for the motor to start for the present agitator stroke. Program step 355 divides the motor start time in register R18 by two and step 356 subtracts one half the motor start time from the remaining stroke time in register R21. The remaining time for the powered portion of the present agitator stroke is now in register R21. At step 365 register R21 is checked to determine if its value is less than or equal to zero and if so, the microcomputer 50 proceeds to step 360 to turn the PSC motor triac 31, 32 off completing the powered portion of the stroke. If the value of the register R21 is greater than zero, the microcomputer 60 proceeds to step 357.

Program steps 357, 358 and 359 constitute a delay loop which provides the remaining stroke time in accordance with the value of register R21. Specifically, step 357 calls the lagging phase montioring routine LPMR 150 to delay for one line half cycle. Step 358 decrements register R21 and decision step 359 causes the program to loop back to step 357 until register R21 has been decremented to zero. When the program falls through decision step 359, step 360 cycles the PSC motor triac 31, 32 OFF.

In actual practice step 360 does not need to know which PSC motor triac 31 or 32 is ON. Both triacs 31 and 32 can be turned OFF in a single programming step without affecting the triac 31 or 32 which is already OFF. Thus, the stroke routine SR 350 returns to the agitate routine AR 450 at the end of the powered portion of each CW and CCW agitator stroke with the PSC motor cycled OFF. The CW triac 31 or CCW trial 32 will continue to conduct until the next time that the triac current approaches a zero-crossing. However, a residual alternating current will continue to flow through a current loop comprising the capacitor 15 and the PSC motor windings 12 and 13. This residual alternating current contains useful motor braking information and can be monitored by counting the residual ferrite core current pulses at the completion of the powered portion of each CW and CCW agitator stroke. The number of residual current zero-crossings is inversely related to the size of the clothes load.

FIG. 9a, 9c, 9e and 9g shows graphic representations of the PSC motor 10 currents immediately before and after the triac 31 or 32 stops conducting. The main winding current Im is shown as a dashed line and the auxiliary winding current Ia is a solid line. When the triac 31 or 32 assumes the blocking state, the main winding current Im quickly asumes the value of the auxiliary winding current Ia as the motor brakes to a stop. This residual, or braking current is labeled Ir. FIG. 9a, 9c, 9e and 9g respectively represent the following washing machine load while agitating: water only; a two pound indian head towel load; a five pound indian head towel load; and an eleven pound indian head towel load. It is seen from these graphs that the residual alternating current Ir becomes progressively shorter with increasing clothes load as the resistance of the clothes load against the agitator helps to decelerate the motor. In fact, the residual alternating current Ir is completely dissipated long before the PSC motor has actually come to a stop. However, the duration of the residual, or braking, current Ir is a measure of the load torque on the agitator at the time that the motor is cycled OFF. FIG. 9b, 9d, 9f and 9h show the ferrite core current pulses 46 corresponding to the PSC motor main Im and auxiliary Ia winding current zero-crossings both prior to and after the triac 31 or 32 has stopped conducting. The curent pulses 46 prior to triac cutout are similar to the current pulses 46 of FIG. 8e. After the triac 31 or 32 stops conducting, both ferrite cores 20 and 23 experiance the same current and generate induced voltage spikes in unison. The residual current pulses stop when the magnitude of the residual alternating current falls below the level required to activate the ferrite cores 20 and 23.

Figure 16:
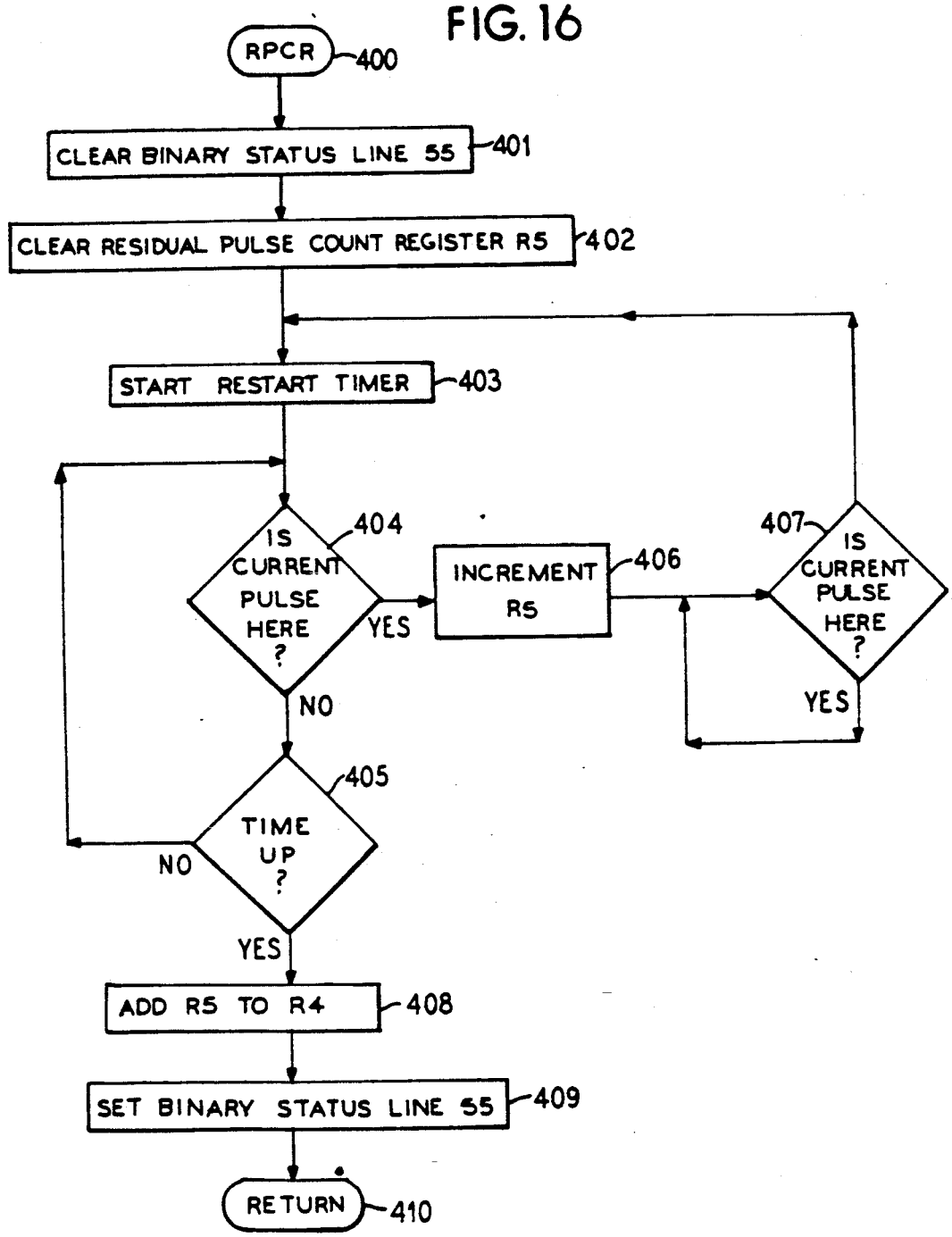
FIG. 16 is a flow chart illustrating the residual pulse count routine RPCR.

A flow chart for the residual pulse count routine RPCR 400 is shown in FIG. 16. The residual pulse count routine RPCR 400 is called by the agitate routine AR 450, immediately following the powered portion of each CW and CCW agitator stroke, to count the number of residual alternating current zero-crossings flowing through the PSC motor windings 12 and 13. As shown in FIG. 9, the number of zero-crossings is inversely related to the PSC motor braking force; i.e., the size of the clothes load.

More specifically, the residual pulse count routine RPCR 400 temporarily disables the watchdog circuit 90 in program step 401 by driving the microcomputer 50 status output line 55 HIGH. The residual pulse count register R5 is cleared in program step 402. The microcomputer 50 timer is started or restarted in step 403. The program then loops through decision steps 404 and 405 until either a residual current pulse occurs, or, sufficient time has elapsed for the assumption to be made that all the residull current pulses for the CW or CCW agitator stroke have been counted. Specifically, decision step 404 branches to program step 406 when a current pulse is detected. The residual pulse count for this CW or CCW stroke is incremented in step 406. The program loops through decision step 407 until the current pulse is gone. The timer is then restarted in step 403. After all the current pulses for the CW or CCW stroke have been accumulated, the program falls through decision step 405 to step 408. The residual pulse count for this CW or CCW stroke in register R5 is added to a residual pulse summing register R4 in step 408. In accordance with the agitate routine AR 450, the residual pulse sum register R4 is used to accumulate the sum of the residual pulse counts over twenty consecutive CW and CCW agitator strokes for averaging purposes. The watchdog circuit 90 is reactivated in step 409 by driving the binary status output line 55 of the microcomputer 50 LOW before program control is returned to the agitate routine AR 450 in step 410.

A flow chart for the agitate routine AR 450 is shown in FIG. 17. The agitate routine AR 450 calls the motor start routine MSR 200, the stroke routine SR 350, the residual pulse count routine RPCR 400 and the agitate time routine ATR 300 as subroutines. The agitate routine AR 450 is called by the main program MP 100 for both the wash and the deep-rinse agitation periods. The agitate routine AR 450 performs a number of control functions during the wash and deep-rinse clothes agitation periods including automatic adjustment of the stroke angle, water level and agitation time for the size and selected type of clothes load.

More specifically, the agitate routine AR 450 clears the agitation time register R1 in step 451. The automatic water level control, AWLC, time register R2 is cleared in step 452. Program steps 453 through 461 acumulate residual current pulse data for a preset number, i.e., twenty, of consecutive CW and CCW agitator strokes. Specifically, the stroke count register R3 is cleared in step 453. The residual pulse sum register R4 is cleared in step 454. A time delay which defines a motor coast or agitator hesitation period is provided in step 455 with the PSC motor 10 OFF. The delay is preferably achieved by the repeated calling of the lagging phase monitoring routine LPMR 150. The CW PSC motor triac 31 or the CCW PSC motor triac 32 is activated on alternate passes by program step 456 wherein a flag is used to remember which direction of agitation had been used on the most previous pass through step 456. The motor start routine MSR 200 is called at step 457. The motor start routine returns to the agitate routine AR 450 with the PSC motor 10 fully accelerated and the motor start time in register R18 for subsequent use by the stroke routine SR 350. The stroke routine SR 350 is called in step 458. The stroke routine SR 350 completes the powered portion of the present CW or CCW agitator stroke in accordance with the size of the clothes load and the user cycle selection. The stroke routine SR 350 returns to the agitate routine AR 450 with the PSC motor 10 OFF. The residual pulse count routine RPCR 400 is called in step 459. The residual pulse count routine RPCR 400 returns to the agitate routine AR 450 with the residual pulse count for the present CW or CCW agitator stroke in register R5 and the cumulative residual pulse sum in register R4. The data in register R5 will subsequently be used by the stroke routine SR 350 to control the stroke angle and the cumulative data in register R4 will be used by the agitate routine AR 450 to control the water level. The stroke count register R3 is incremented in program step 460. Decision step 461 loops back to step 455 until data for twenty consecutive CW or CCW agitator strokes have been accumulated, whereupon the programs falls through to decision step 462.

It is undesirable for the washing machine 600 to provide additional water fill just before the completion of a wash or deep-rinse agitation period and yet it is sometimes necessary to add additional water if the user opens the lid to add additional clothes to the load when clothes agitation is already in progress. Beginning with decision step 462, the program loop comprising steps 463 and 465 in conjunction with steps 469 and 474 combine to define the period or periods of time when the automatic water level control AWLC procedure is active. Whenever the lid is open, it is assumed that the user might be adding additional clothes to the load so that the control checks to determine whether additional water is necessary and if so whether simultaneous agitation and water fill may be performed. This check is made even if the lid is not open for a fixed sample period as determined by step 469. Specifically, if the lid is open, program step 464 clears the AWLC time register R2. If the machine overload display is ON, the display is turned OFF in step 465. In other words, if a machine overload condition has previously been detected, it will be assumed that the user has received the "machine overload" message by the next time that the lid is opened. Or, if the lid is closed, the AWLC time register R2 is incremented in program step 463. Decision step 466 aborts the AWLC procedure if the water is already at the maximum level for the washing machine 600. However, the cumulative residual pulse sum data in register R4 can now be used to check for an overloaded machine condition in decision step 467. If the residual current pulse sum in register R4 is below the machine overload threshold of, say, twenty-six decision step 467 branches to step 468 to provide an overload indication by the microcomputer 50 turning on the console machine overload display or light emitting diode. At step 468 the microcomputer 50 further sets a flag to cause the stroke routine SR 350 to limit the duration of the CW and CCW agitator strokes for the remainder of the present cycle. Program control passes to step 475. Alternatively, if the water is below the maximum water level, decision step 469 passes program control to step 475 if the AWLC time in register R2 has expired; otherwise, decision steps 470 and 471 are used to determine whether or not additional water is needed and if so, whether or not it is appropriate to allow simultaneous clothes agitation during the additional water fill procedure. Specifically, decision step 470 compares the residual pulse sum register R4 to a threshold designed to determine if the present water level is grossly insufficient. If register R4 is less than, say, thirty-eight, decision step 470 branches to program step 473 which pauses to fill three additional vertical inches of water or until the maximum water level is attained, before advancing to program step 474. Otherwise, decision step 470 branches to decision step 471 which compares the residual pulse sum register R4 to a less severe threshold, for example, forty-five and branches to step 475 if the present water level is adequate or to step 472 if additional water is required. Program step 472 activates the appropriate fill solenoids 66 and/or 67 in accordance with the wash or deep-rinse cycle status and the user water temperature selection and immediately advances to program step 474 to facilitate simultaneous clothes agitation and water fill. Program step 474 clears the AWLC time register R2. This assures that the automatic water level control AWLC period will not time out during or immediately after an AWLC water fill procedure has taken place. The program then loops back to step 453 to sample data from the next twenty agitation strokes.

Program step 475 deactivates the fill solenoids 66 and 67. If the fill solenoids are already OFF, step 475 has no effect. The agitate time routine ATR 300 is called at step 476. The agitate time routine ATR 300 computes the optimal clothes agitation time in accordance with the cycle, water temperature, water level and wash or deep-rinse cycle status. The agitate time routine ATR 300 returns to the agitate routine AR at step 477 with the desired agitation time in register R6. The elapsed agitation time register R1 is incremented in step 477. Note that the elapsed agitation time register R1 is not incremented during periods of water fill or simultaneous water fill and clothes agitation. Decision step 478 compares the elapsed agitiation time in register R1 with the computed optimal agitation time in register R6 and branches to step 479 if the elapsed wash or deep-rinse agitation time exceeds the optimal agitation time. Otherwise, the program loops back to step 453 to sample data from the next twenty agitation strokes.

The agitate routine AR 450 thus provides from about three to eighteen minutes of wash agitation with the shortest agitation time for a delicate cycle with a minimal clothes load in hot water and the maximum agitation time for a normal, i.e., cotton cycle with a maximum clothes load in cold water. The deep-rinse agitation times are about one fourth as long as the corresponding wash agitation times. The water level and duration of each CW and CCW stroke is automatically adjusted for the size and type of clothes load. The user is free to change the cycle selection and water temperature selection at any time and the user may add additional clothes to the load by opening the lid at any time during the cycle. A machine overload condition is detected and communicated to the user. If additional water is necessary, the control provides either continuous fill and agitation or fill without simultaneous agitation in accordance with the degree to which the present water level is insufficient.

Figure 18:
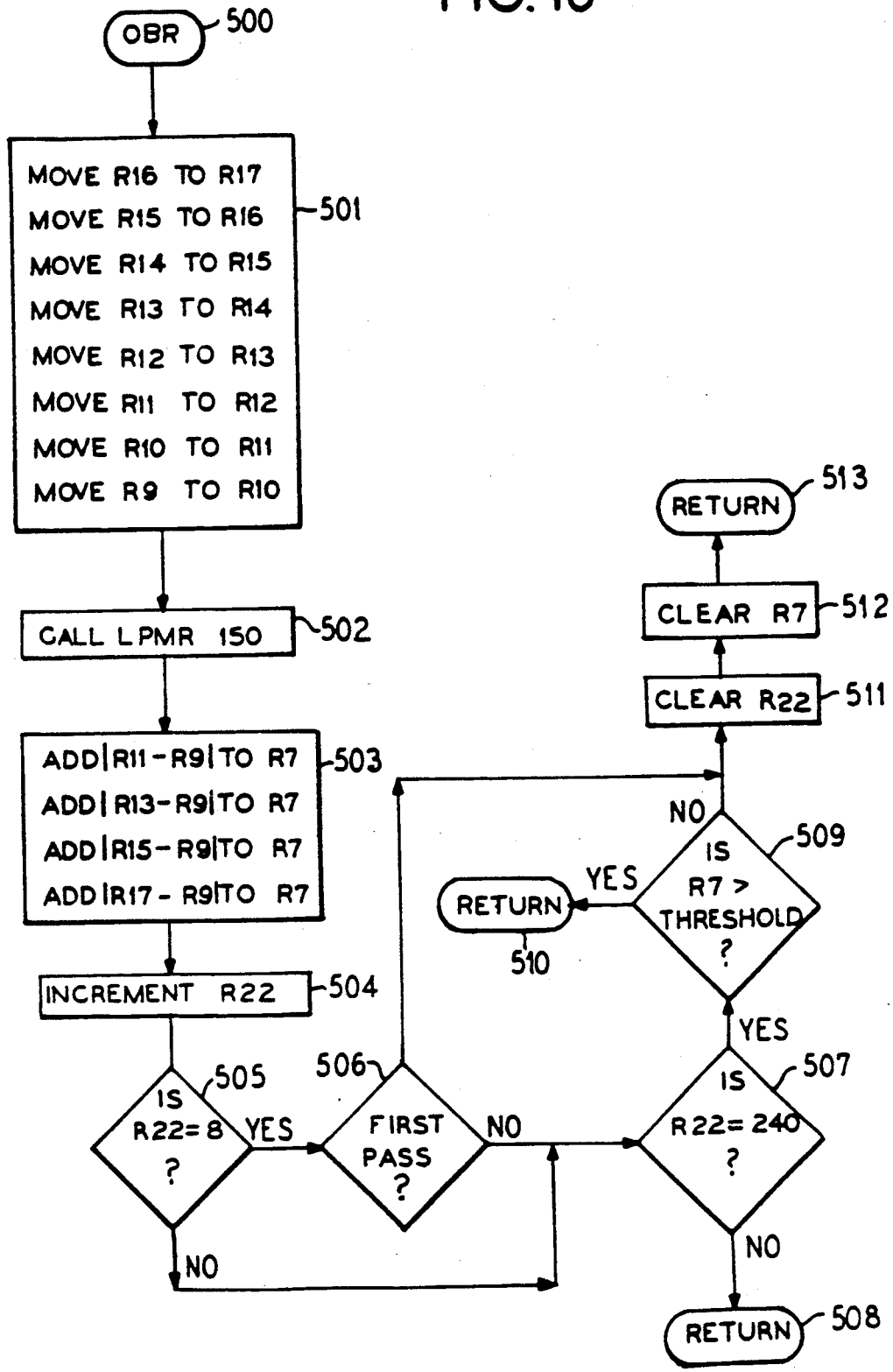
FIG. 18 is a flow chart illustrating the off-balance routine OBR.

A flow chart for the off-balance routine OBR 500 is shown in FIG. 18. The off-balance routine OBR 500 is called 120 times per second by the spin routine SPNR 550 to compute the amount of dither in the PSC motor 10 torque for the purpose of detecting a spin off-balance condition. At a step 501 the off-balance routine OBR 500 adjusts a data memory stack comprising the last nine lagging motor phase numbers. Specifically, the eighth last lagging motor phase number in register R16 becomes the new ninth last lagging motor phase number in register R17. The seventh last lagging motor phase number in register R15 becomes the new eighth last lagging motor phase number in register R16. Similarly, the contents of the register R14 is moved to the register R15. The contents of the register R13 is moved to the register R14. The contents of the register R12 is moved to the register R13. The contents of the register R11 is moved to the register R12. The contents of the register R10 is moved to the register R11. And the most recent lagging motor phase number in register R9 is moved to the second last lagging motor phase number position in register R10. The lagging phase monitoring routine LPMR 150 is called in program step 502. The lagging phase monitoring routine LPMR returns to the off-balance routine OBR at step 503 with the new last lagging motor phase number in register R9. The data stack of the last nine lagging motor phase numbers is fully loaded when the off-balance routine OBR 500 has been called for nine or more consecutive line half cycles.

When the data stack is loaded, the data memory registers R9, R11, R13, R15 and R17 all contain data from either positive, or negative line half cycles. An auto-referencing technique is used in program step 503 to accumulate a number related to the dither in the PSC motor 10 torque which is substantially unaffected by asymmetry between positive and negative line voltage half cycles or by component variations between comparator circuits CM 2 and CM 3 of the current pulse circuit 40. More particularly, at step 503, the absolute value of the difference between register R11 and register R9 is added to register R7; the absolute value of the difference between register R13 and R9 is added to register R7; the absolute value of the difference between register R15 and R9 is added to register R7; and the absolute value of the difference between register R17 and R9 is added to register R7. Register R7 represents the cumulative dither in the PSC motor 10 torque.

As will be shown in subsequent program steps, the off-balance routine OBR 500 accumulates the motor dither in register R7 for a preset sample period and periodically compares the accumulated dither number to a preset threshold number to determine whether or not the spin basket is sufficiently unbalanced to introduce excessive motor torque dither or motor torque "hunting" into the spin drive train of the washing machine 600. The off-balance sample count register R22 is incremented in program step 504. Decision steps 505 and 506 cause the program to branch to step 511 after the first eight times that the off-balance routine OBR 500 is called by the spin routine SR 550 to initialize parameters after assuring that the data stack of the last nine lagging motor phase numbers contains good data. Specifically, decision step 505 branches to decision step 506 if the sample count register R22 is eight; otherwise, the program falls through decision step 505 to decision step 507. Decision step 506 branches to step 511 on the first pass for each spin extraction period; otherwise, the program falls through decision step 506 to decision step 507. Those who are skilled in the art will know how a flag can be used for this purpose. Decision step 507 branches to decision step 509 when the present motor dither sample has been completed; otherwise, the program falls through decision step 507 to step 508 wherein the program returns to the spin routine SPNR 550. Decision step 509 compares the accumulated PSC motor 10 dither number in register R7 to a preset threshold. Decision step 509 branches to step 510 to return to the spin routine SPNR 550 with register R22 equal to 240 if the PSC motor 10 dither is above threshold; otherwise, the program falls through decision step 509 to step 511. Program steps 511 and 512 clear the spin off-balance parameters in preparation for the next PSC motor 10 dither sample. Specifically, step 511 clears the sample count register R22 and step 512 clears the motor dither number in register R7 prior to returning to the spin routine SPNR 550 at step 513.

Figure 19:
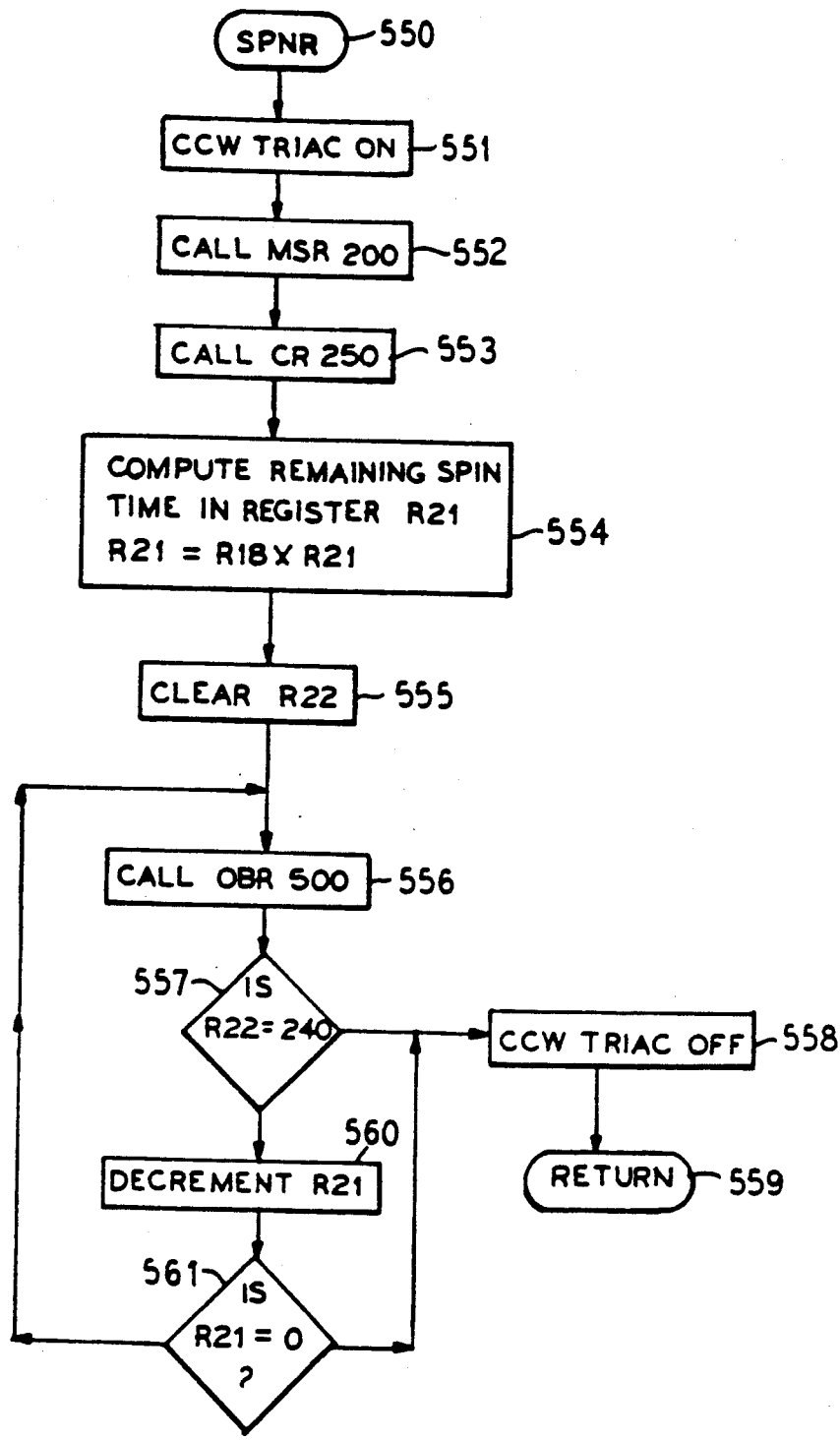
FIG. 19 is a flow chart illustrating the spin routine SPNR.

A flow chart for the spin routine SPNR 550 is shown in FIG. 19. The spin routine SPNR 550 automatically adjusts the spin extraction time as per the user cycle selection and the time required for the spin basket to fully accelerate; i.e., the time required for the motor to start when accelerating the spin basket load. The spin routine aborts the remaining spin period if a spin off-balance condition is detected by the off-balance routine OBR. More specifically, the spin routine SPNR 550 activates the spin direction PSC motor 10 triac 32 at step 551 and calls the motor start routine MSR 200 at step 552. The motor start routine MSR 200 returns to the spin routine SPNR 550 several seconds later with the motor start time; i.e., the spin basket acceleration time, in register R18. Large clothes loads of highly absorbent material present a larger inertial load to the PSC motor 10 and, hence, require a longer spin basket acceleration time than small clothes loads or loads comprised of less absorbent material. The spin basket acceleration time is thus highly correlated with the optimal spin extraction time for any given clothes load. Note that this parameter, spin basket acceleration time, does not require any sensors in the tub or drain area of the washing machine as is often the case with prior art controls featuring an end-of-spin detection capability. Such prior art sensors can become coated with calcium carbonate material in hard water areas and provide additional opportunity for a water leak in the tub or drain area.

The spin routine SPNR 550 then calls the cycle routine CR 250 at step 553. The cycle routine CR 250 returns to the stroke routine SR at step 352 with twenty, thirty or forty loaded in data memory register R21 for user selected delicate, permanent press or normal cycles, respectively. The spin routine then combines the cycle information with the above motor start time information to compute the optimal remaining spin time at step 554. Specifically, a "multiply by successive addition" subroutine is used to multiply the cycle parameter in register R21 by the motor start time in register R18 such that the result is in register R21. Program step 555 clears the off-balance routine OBR 500 motor dither sample time in register R22 prior to the first calling of the off-balance routine OBR 500. The program then loops through steps 556, 557, 558 and 559 until either the optimal spin time is completed or until a spin off-balance condition has been detected by the off-balance routine OBR 500. Specifically, the off-balance routine OBR 500 is called at program step 556. The off-balance routine OBR 500 returns to the spin routine SPNR 550 at decision step 557 with the dither sample time register R22 loaded with 240 if a spin off-balance condition has been detected. Decision step 557 branches to program step 558 to abort the remaining spin time if register R22 is 240; otherwise, the program falls through decision step 557 to step 560 which decrements the remaining spin time register R21. Decision step 561 terminates the spin extraction period by branching to program step 558 when the remaining spin time in register R21 has been decremented to zero; otherwise, the program branches back to step 556.

Although the preferred embodiment contains a motor start routine MSR 200 and an off-balance routine OBR 500 which use lagging PSC motor 10 phase data, those skilled in the art will recognize that similar routines could be developed which use leading PSC motor phase data with a modified phase monitoring routine. The exemplary embodiment was chosen to use two ferrite core sensors 20 and 23 because this is the most general case; i.e., both leading and lagging PSC motor 10 phase information is available regardless of whether the PSC motor 10 is operating in the CW or the CCW direction.

Figure 1B:
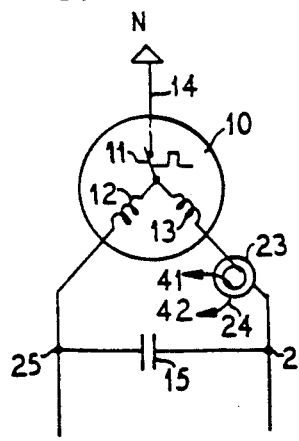
FIG. 1b is a first alternative embodiment of the sensing portion of the circuit shown in FIG. 1a employing a single ferrite core sensor.
Figure 1C:
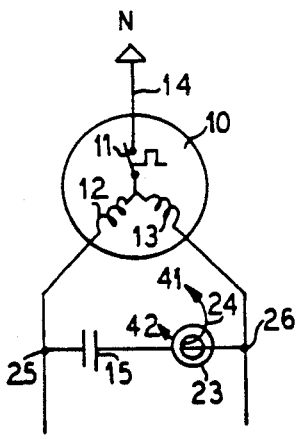
FIG. 1c is a second alternative embodiment of the sensing portion of the circuit shown in FIG. 1a employing a single ferrite core, sensor.
Figure 1D:
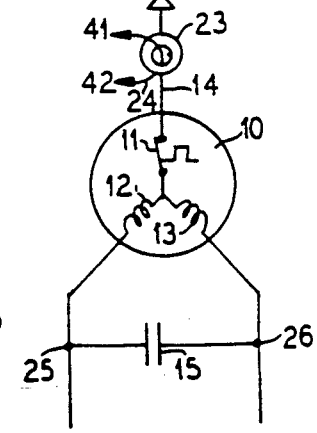
FIG. 1d is a third alternative embodiment of the sensing portion of the circuit shown in FI. 1a employing a single ferrite core sensor.

Other sensor configurations are shown in FIGS. 1b, 1c and 1d. Each of these configurations results in a circuit cost reduction, but does not provide all of the phase information that is available from the configuration of FIG. 1a. In FIG. 1i, a single ferrite core sensor 23 is used to acquire lagging PSC motor main winding phase data when the CCW triac 32 is active or leading motor auxiliary winding phase data when the CW triac 31 is active. In FIG. 1c, a single ferrite core sensor 23 is used to acquire leading PSC motor auxiliary winding phase data in either the CW or CCW motor direction. The circuits of FIG. 1i and 1c also provide residual alternating current information as with the exemplary circuit. In FIG. 1d, a single ferrite core sensor 23 is used to acquire PSC motor phase data for the total resultant PSC motor current of the combined main and auxiliary windings. More particularly, the primary winding 14 of the core 23 in FIG. 1d is the resultant of the main and auxiliary winding currents. The single ferrite core 23 circuit of FIG. 1d does not provide residual alternating current information because the primary winding of the core 23 is not formed of either of the PSC motor windings 12 or 13 and the core 23 is not in the residual current loop of the capacitor 15. Further, the basic PSC motor phase information is not as useful with the circuit of FIG. 1d as with any of the other configurations, because an increase in motor torque causes opposite effects in the main and auxiliary winding currents.

Many modifications and variations of the present invention are possible in light of the above teachings. Accordingly, it is to be understood that, within the scope of the appended claims, the invention may be practiced otherwise than as specifically described hereinabove.

What is claimed and desired to be secured by Letters Patent is:

1. A control system for an automatic washing machine having an agitation means and a motor with a first winding, said motor being coupled to said agitation means for drive said agitation means, said control system comprising:
   means for cyclnig said motor off;
   means for sensing the residual alternating current in said motor when said motor is cycled off and for providing a representation thereof; and means for controlling the operation of said washing machine in response to said residual current representation, wherein said control means automatically controls the level of water in said washing machine in response to the duration of said residual current representation such that the smaller said duration representation, the higher said water level.

2. The control system of claim 1 including means responsive to the duration of said residual current representation for detecting an overload condition in said washing machine.

3. The control system of claim 1 including means for determining whether or not to cause said motor to agitate while increasing said water level.

4. The control system of claim 1 including means for summing the durations of said residual current representations over a predetermined number of agitator strokes to provide a representation of said sum, said water level control means controlling said water level such that the smaller said sum representation, the higher said water level.

5. The control system of claim 4 including means responsive to said sum representation for detecting an overload condition in said washing machine.

6. The control system of claim 1 wherein said motor is a permanent split capacitor motor wherein said means for sensing the residual alternating current comprises:
means for sensing zero crossings of alternating current in a motor winding when said motor is cycled off to provide a signal representative thereof; and
means for counting the number of sensed zero crossings to provide a sum, said sum being inversely related to the braking force on said motor.

7. The control system of claim 6 wherein said control means automatically controls the level of water in said washing machine in response to said sum representation such that the smaller said sum representation, the higher said water level.

8. The control system of claim 7 including means responsive to said sum representation for detecting an overload condition in said washing machine.

9. The control system of claim 7 including means for determining whether or not to cause said motor to agitate while increasing said water level.

10. The control system of claim 7 including means for adding said sum representations over a predetermined number of motor strokes to provide a total representation, said water level control means controlling said water level such that the smaller said total representation, the higher said water level.

11. The control system of claim 10 including means responsive to said total representation for detecting an overload condition in said washing machine.

12. The control system of claim 7 including means responsive to said sum representation for detecting an overload condition in said washing machine.

13. The control system of claim 6 wherein said control means includes means for controlling the stroke angle of said agitation means in response to said sum representation wherein the smaller said sum representation, the greater said stroke angle.

14. The control system of claim 6 wherein said washing machine includes means actuable by a user for selecting a cycle and providing a representation of said cycle selection, and wherein said control means includes means for controlling the stroke angle of said agitator in response to said sum representation and said cycle selection.

15. The control system of claim 6 wherein said control means is responsive to said sum representation to determine the duration of an agitation operation of said washing machine.

16. The control system of claim 1 wherein said control means includes means for controlling the stroke angle of said agitator in response to said residual current duration representation wherein the smaller said duration representation, the greater said stroke angle.

17. The control system of claim 1 wherein said washing machine includes means actuable by a user for selecting a cycle to provide a representation of said cycle selection and said control means includes means for controlling the stroke angle of said agitator in response to said residual current duration representation and said cycle selection representation.

18. The control system of claim 1 wherein said control means is responsive to said residual current duration representation to determine the size of the load in said washing machine during a water fill operation, an agitation operation, or a rinse operation.

19. The control system of claim 1 wherein said control means is responsive to said residual current duration representation to determine the duration of an agitation operation of said washing machine.

20. The control system of claim 19 wherein said washing machine includes means actuable by a user for selecting a cycle and providing a representation thereof, and wherein said duration determining means is further responsive to said cycle selection representation to determine said duration.

21. The control system of claim 20 wherein said washing machine includes means actuable by a user for selecting a temperature and providing a representation thereof, wherein said duration determining means is further responsive to said temperature selection representation to determine said duration.

22. An automatic washing machine comprising:
agitation means for agitating a load;
a reversible motor with first and second windings, said motor being coupled to said agitation means to drive said agitation means;
means for periodically energizing said motor for causing said motor alternately to rotate in opposite directions and for cycling said motor off between energization;
means for sensing the residual alternating current in said first and second motor windings when said motor is cycled off and for providing a representation thereof; and
means for controlling the operation of said washing machine in response to said residual current representation, wherein said means for controlling the operation of said washing machine in response to said residual current representation comprises means for controlling the stroke angle of said agitation means in response to said residual current.

23. The automatic washing machine in claim 22 wherein said motor is a permanent split capacitor motor.

24. The automatic washing machine of claim 23 wherein said means for sensing said residual current comprises:
means for counting the number of sensed zero crossings to provide a sum, said sum being inversely related to the braking force on said motor.

25. The automatic washing machine of claim 22 wherein said means for controlling the operation of said washing means in response to said residual current representation comprises means for controlling the duration of an agitation cycle of said automatic washing machine in response to said residual current.

26. The automatic washing machine of claim 22 wherein said means for controlling the operation of said washing machine in response to said residual current representation comprises means for controlling the level of water in said automatic washer in response to said residual current.

27. The automatic washing machine of claim 22 wherein said means for controlling the operation of said washing machine in response to said residual current representation comprises means for detecting an overload condition in said washer.

28. The automatic washing machine of claim 22 wherein said means for controlling the operation of said washing machine in response to said residual current representation comprises means for determining whether or not to operate said motor to drive said agitation means during a fill operation in response to said residual current representation.

29. The automatic washing machine of claim 22 further comprising means for sensing the load on the motor when the motor is operating under power and for providing a representation of said load, said controlling means controlling the operation of said washing machine in response to both said representation of said residual current and said representation of said load.

30. The automatic washing machine of claim 29 wherein:
said residual current sensing means comprises means for sensing and counting the number of zero crossings of alternating current when said motor is cycled off; and further wherein
said load sensing means ,comprises means for determining the motor phase angle and for detecting a characteristic increase in said motor phase angle representing the time when said motor attains full operating speed.

31. The automatic washing machine of claim 22 further comprising cycle selection means for selecting a cycle of operation for said washing machine, said controlling means controlling the operation of said washing machine in response to both said representation of said residual current and said representation of said cycle.

32. A method of washing clothes in an automatic washing machine having a rotatable laundering vessel, an agitator disposed within said vessel, a reversible permanent split capacitor motor coupled to said rotatable laundering vessel and said agitator to selectively drive said rotatable laundering vessel and said agitator, said motor having first and second windings and being powered by a power supply having an alternating line voltage, said method comprising the steps of:
periodically energizing said motor to effect agitation of said agitator and sensing zero crossings of alternating current in said first and second motor windings when said motor is cycled off between energizations thereof to provide a signal representative thereof;
counting the number of sensed zero crossings to provide a sum, said sum being inversely related to the braking force on said motor; and
controlling the operation of said washing machine in response to said braking force representation, wherein said step of controlling the operation of said washing machine in response to said braking force representation comprises controlling the stroke angle of said agitator in response to said braking force.

33. The method of claim 32 wherein said step of controlling the operation of said washing machine in response to said braking force representation comprises determining whether or not to operate said motor to drive said agitation means during a fill operation in response to said braking force representation.

34. The method of claim 32 wherein said step of controlling the operation of said washing machine in response to said braking force representation comprises:
controlling the stroke angle of said agitator in response to said braking force;
controlling the duration of an agitation cycle of said automatic washing machine in response to said braking force;
controlling the level of water in said automatic washing machine in response to said braking force; and
determining whether or not to operate said motor to drive said agitation means during a fill operation in response to said braking force representation.

35. A method of washing clothes in an automatic washing machine having a rotatable laundering vessel, an agitator disposed within said vessel, a reversible permanent split capacitor motor coupled to said rotatable laundering vessel and said agitator to selectively drive said rotatable laundering vessel and said agitator, said motor having first and second windings and being powered by a power supply having an alternating line voltage, said method comprising the steps of:
periodically energizing said motor to effect agitation of said agitator and sensing zero crossings of alternating current in said first and second motor windings when said motor is cycled off between energizations thereof to provide a signal representative thereof;
counting the number of sensed zero crossings to provide a sum, said sum being inversely related to the braking force on said motor; and
controlling the operation of said washing machine in response to said braking force representation, wherein said step of controlling the operation of said washing machine in response to said braking force representation comprises controlling the duration of an agitation cycle of said automatic washing machine.

36. The method of claim 35 wherein said step of controlling the operation of said washing machine in response to said braking force representation comprises determining whether or not to operate said motor to drive said agitation means during a fill operation in response to said braking force representation.

37. A method of washing clothes in an automatic washing machine having a rotatable laundering vessel, an agitator disposed within said vessel, a reversible permanent split capacitor motor coupled to said rotatable laundering vessel and said agitator to selectively drive said rotatable laundering vessel and said agitator, said motor having first and second windings and being powered by a power supply having an alternating line voltage, said method comprising the steps of:
periodically energizing said motor to effect agitation of said agitator and sensing zero crossings of alternating current in said first and second motor windings when said motor is cycled off between energizations thereof to provide a signal representative thereof;

counting the number of sensed zero crossings to provide a sum, said sum being inversely related to the braking force on said motor; and controlling the operation of said washing machine in response to said braking force representation, wherein said step of controlling the operation of said washing machine in response to said braking force representation comprises controlling the level of water in said automatic washing machine in response to said braking force.

38. The method of claim 37 wherein said step of controlling the operation of said washing machine in response to said braking force representation comprises determining whether or not to operate said motor to drive said agitation means during a fill operation in response to said braking force representation.

39. A method of washing clothes in an automatic washing machine having a rotatable laundering vessel, an agitator disposed within said vessel, a reversible permanent split capacitor motor coupled to said rotatable laundering vessel and said agitator to selectively drive said rotatable laundering vessel and said agitator, said motor having first and second windings and being powered by a power supply having an alternating line voltage, said method comprising the steps of:

periodically energizing said motor to effect agitation of said agitator and sensing zero crossings of alternating current in said first and second motor windings when said motor is cycled off between energizations thereof to provide a signal representative thereof;

counting the number of sensed zero crossings to provide a sum, said sum being inversely related to the braking force on said motor; and controlling the operation of said washing machine in response to said braking force representation, wherein said step of controlling the operation of said washing machine in response to said braking force representation comprises detecting an overload condition in said washing machine.

40. The method of claim 39 wherein said step of controlling the operation of said washing machine in response to said braking force representation comprises determining whether or not to operate said motor to drive said agitation means during a fill operation in response to said braking force representation.

41. An automatic washing machine powered by a supply having an alternating line voltage comprising:
an agitator;
a spin basket;
a permanent split capacitor motor coupled to said agitator and to said spin basket to selectively drive said agitator and spin basket, said motor having first and second windings;
means coupled to said motor for periodically energizing said first and second windings to cause said motor to effect agitation and for cycling said motor off between successive energizations to effect agitation of said agitator;
means for sensing zero crossings of alternating current in said first and second motor windings when said motor is on to provide a representation of said current zero crossings and, when said motor is cycled off, to provide a representation of residual current flowing through said first and second motor windings;

means responsive to said line voltage and said current zero crossing representation for determining a motor phase angle to provide a representation thereof; and means for controlling various operations of said washing machine in response to said residual current representation and said motor phase angle representation, wherein said control means includes means for determining the optimal stroke angle of said agitator, said cycling means being responsive to said control means for cycling said motor off in accordance with said optimal stroke angle.

42. An automatic washing machine as recited in claim 41 wherein said control means includes means responsive to said residual current representation for automatically controlling the level of water in said washing machine in accordance with the size of the load in said washing machine.

43. An automatic washing machine as recited in claim 42 wherein said control means includes means responsive to said residual current representation for determining an overload condition while controlling the level of water in said washing machine.

44. An automatic washing machine as recited in claim 42 wherein said control means includes means responsive to said residual current representation for determining whether said motor should be cycled off to stop agitation while increasing the water level in said washing machine.

45. An automatic washing machine as recited in claim 41 wherein said control means includes means responsive to said residual current representation for determining the duration of an agitation operation of said washing machine.

46. An automatic washing machine as recited in claim 41 wherein said control means includes means responsive to said motor phase angle representation for determining the duration of a spin operation of said washing machine.

47. An automatic washing machine powered by a supply having an alternating line voltage comprising:
an agitator;
a spin basket;
a permanent split capacitor motor coupled to said agitator and to said spin basket to selectively drive said agitator and spin basket, said motor having first and second windings;
means coupled to said motor for periodically energizing said first and second windings to cause said motor to effect agitation and for cycling said motor off between successive energizations to effect agitation of said agitator;
means for sensing zero crossings of alternating current in said first and second motor windings when said motor is on to provide a representation of said current zero crossings and, when said motor is cycled off, to provide a representation of residual current flowing through said first and second motor windings;

means responsive to said line voltage and said current zero crossing representation for determining a motor phase angle to provide a representation thereof; and means for controlling various operations of said washing machine in response to said residual current representation and said motor phase angle representation, wherein said control means includes means responsive to said motor phase angle representation for determining the amount of dither in said motor during a spin operation of said washing machine.

48. An automatic washing machine as recited in claim 41 wherein said control means includes means responsive to the determined amount of dither for determining an off balance condition during said spin operation.

49. An automatic washing machine as recited in claim 47 wherein said control means includes means for determining the optimal stroke angle of said agitator, said cycling means being responsive to said control means for cycling said motor off in accordance with said optimal stroke angle.

50. An automatic washing machine as recited in claim 47 wherein said control means includes means responsive to said residual current representation for automatically controlling the level of water in said washing machine in accordance with the size of the load in said washing machine.

51. An automatic washing machine as recited in claim 50 wherein said control means includes means responsive to said residual current representation for determining an overload condition while controlling the level of water in said washing machine.

52. An automatic washing machine as recited in claim 50 wherein said control means includes means responsive to said residual current representation for determining whether said motor should be cycled off to stop agitation while increasing the water level in said washing machine.

53. An automatic washing machine as recited in claim 47 wherein said control means includes means responsive to said residual current representation for determining the duration of an agitation operation of said washing machine.

54. An automatic washing machine as recited in claim 47 wherein said control means includes means responsive to said residual current representation for determining the duration of a spin operation of said washing machine.

* * * * *